(12) United States Patent
Song et al.

(10) Patent No.: US 11,665,914 B2
(45) Date of Patent: *May 30, 2023

(54) THREE DIMENSIONAL SEMICONDUCTOR MEMORY DEVICES

(71) Applicant: SAMSUNG ELECTRONICS CO., LTD., Suwon-si (KR)

(72) Inventors: Si-Ho Song, Suwon-si (KR); Jeonghee Park, Suwon-si (KR); Changhyun Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/406,166

(22) Filed: Aug. 19, 2021

(65) Prior Publication Data
US 2021/0384256 A1 Dec. 9, 2021

Related U.S. Application Data

(63) Continuation of application No. 16/710,450, filed on Dec. 11, 2019, now Pat. No. 11,127,792.

(30) Foreign Application Priority Data

Jun. 12, 2019 (KR) ........................ 10-2019-0069618

(51) Int. Cl.
*H01L 27/24* (2006.01)
*H01L 45/00* (2006.01)
*G11C 5/06* (2006.01)

(52) U.S. Cl.
CPC ............ *H01L 27/249* (2013.01); *G11C 5/063* (2013.01); *H01L 45/06* (2013.01); *H01L 45/1253* (2013.01); *H01L 45/141* (2013.01)

(58) Field of Classification Search
CPC ... H01L 27/249; H01L 45/06; H01L 45/1253; H01L 45/141; H01L 27/24; H01L 27/2409; H01L 29/861; H01L 45/04; G11C 5/063
See application file for complete search history.

(56) References Cited

U.S. PATENT DOCUMENTS 7,704,788 B2 4/2010 Youn et al.
7,719,886 B2 5/2010 Philipp et al.
(Continued)

FOREIGN PATENT DOCUMENTS

KR 10-1447813 B1 10/2014
KR 10-1511421 B1 4/2015
KR 10-1511871 B1 4/2015

*Primary Examiner* — Allison Bernstein
(74) *Attorney, Agent, or Firm* — Lee IP Law, P.C.

(57) ABSTRACT

A three-dimensional semiconductor memory device includes first conductive lines extending horizontally in a first direction, a second conductive line extending vertically in a second direction perpendicular to the first direction, and memory cells at cross-points between the first conductive lines and the second conductive line. The first conductive lines are laterally spaced apart from each other in a third direction crossing the first direction. Each of the memory cells includes a variable resistance element and a switching element that are horizontally arranged. The variable resistance element includes a first variable resistance pattern and a second variable resistance pattern arranged in the second direction, a first electrode between the first variable resistance pattern and the first conductive line, a second electrode between the second variable resistance pattern and the second conductive line, and a third electrode between the first variable resistance pattern and the second variable resistance pattern.

26 Claims, 31 Drawing Sheets

(56) References Cited

U.S. PATENT DOCUMENTS

| | | |
|---|---|---|
| 8,119,478 B2 | 2/2012 | Jeong et al. |
| 8,124,968 B2 | 2/2012 | Koo et al. |
| 8,664,633 B2 | 3/2014 | Park et al. |
| 9,013,917 B2 | 4/2015 | Kang |
| 9,490,426 B2 | 11/2016 | Shepard et al. |
| 9,564,585 B1 | 2/2017 | Lille et al. |
| 10,930,847 B2 | 2/2021 | Yamaguchi et al. |
| 2018/0358094 A1 | 12/2018 | Allegra et al. |

THREE DIMENSIONAL SEMICONDUCTOR MEMORY DEVICES

CROSS-REFERENCE TO RELATED APPLICATION

This is a continuation of U.S. patent application Ser. No. 16/710,450 filed Dec. 11, 2019, which is incorporated by reference herein in its entirety.

Korean Patent Application No. 10-2019-0069618, filed on Jun. 12, 2019, in the Korean Intellectual Property Office, and entitled: "Three Dimensional Semiconductor Memory Devices," is incorporated by reference herein in its entirety.

BACKGROUND

1. Field

Example embodiments of the present disclosure relate to three-dimensional semiconductor memory devices, and more specifically, to three-dimensional semiconductor memory devices including variable resistance memory cells.

2. Description of the Related Art

A semiconductor device is highly integrated to meet demands of high performance and low costs. For example, an integration degree of a two-dimensional (2D) or planar semiconductor device is mainly determined by an area used for a unit memory cell. Therefore, the integration density of the 2D or planar semiconductor device depends on a technique used for a fine pattern formation. However, a high-cost equipment is required for such a fine pattern formation in a 2D or planar semiconductor manufacturing process and increase of the integration density of the 2D or planar semiconductor device is limited. A three-dimensional semiconductor memory device including memory cells arranged three-dimensionally has been developed to overcome the above limitations.

In addition, according to demands for high capacity and low power memory devices, next-generation memory devices that are nonvolatile and do not refresh, such as a phase change random access memory (PRAM), a nano floating gate memory, a polymer RAM (PoRAM), a magnetic RAM (MRAM), a ferroelectric RAM (FRAM), or a resistive RAM (RRAM) have been studied.

SUMMARY

According to example embodiments, a three dimensional semiconductor device may include a substrate, a plurality of first conductive lines extending in a first direction parallel to an upper surface of the substrate, and spaced apart from each other in a second direction crossing the first direction and parallel to the upper surface of the substrate, a second conductive line extending in a third direction perpendicular to the first direction and the second direction, and a plurality of memory cells disposed at cross-points between the plurality of first conductive lines and the second conductive line, each of the plurality of memory cells including a variable resistance element and a switching element that are horizontally arranged in the second direction. The variable resistance element may include a first variable resistance pattern and a second variable resistance pattern arranged in the second direction, a first electrode between the first variable resistance pattern and the first conductive line, a second electrode between the second variable resistance pattern and the second conductive line, and a third electrode between the first variable resistance pattern and the second variable resistance pattern. The first electrode, the second electrode, and the third electrode may have different resistivities.

According to example embodiments, a three dimensional semiconductor device may include a substrate, a first conductive line extending in a first direction parallel to an upper surface of the substrate, a second conductive line extending in a second direction perpendicular to the upper surface of the substrate and intersecting the first conductive line, and a plurality of memory cells disposed between the first conductive line and the second conductive line. Each of the plurality of memory cells may include a first variable resistance pattern and a second variable resistance pattern arranged in a third direction crossing the first direction and the second direction and parallel to the upper surface of the substrate. Each of the first and second variable resistance patterns may include a sidewall portion adjacent to a sidewall of the first conductive line and a plurality of horizontal portions extending in the third direction from opposite ends of the sidewall portion.

According to example embodiments, a three dimensional semiconductor device may include a substrate, a plurality of stack structures and a plurality of buried insulating patterns alternatively arranged on the substrate in a first direction parallel to an upper surface of the substrate, each of the plurality of stack structures including a plurality of memory cells and a plurality of insulation layers alternately stacked on each other in a second direction perpendicular to the upper surface of the substrate, a plurality of first conductive lines extending in the first direction, at first sides of the plurality of memory cells and stacked in the second direction, and a plurality of second conductive lines disposed between respective ones of the plurality of buried insulating patterns, at second sides of the plurality of memory cells opposite to the first sides of the plurality of memory cells. Each of the plurality of memory cells may include a plurality of variable resistance patterns and a plurality of electrodes between respective ones of the plurality of variable resistance patterns. The plurality of electrodes may have different resistivities.

BRIEF DESCRIPTION OF THE DRAWINGS

Features will become apparent to those of skill in the art by describing in detail exemplary embodiments with reference to the attached drawings in which:

FIGS. 13A, 14A, 15A, 16, 17, and 18 are cross-sectional views taken along line I-I' of FIG. 2, and FIGS. 13B, 14B, and 15B are cross-sectional views taken along line II-II' of FIG. 2.

DETAILED DESCRIPTION

Figure 1:
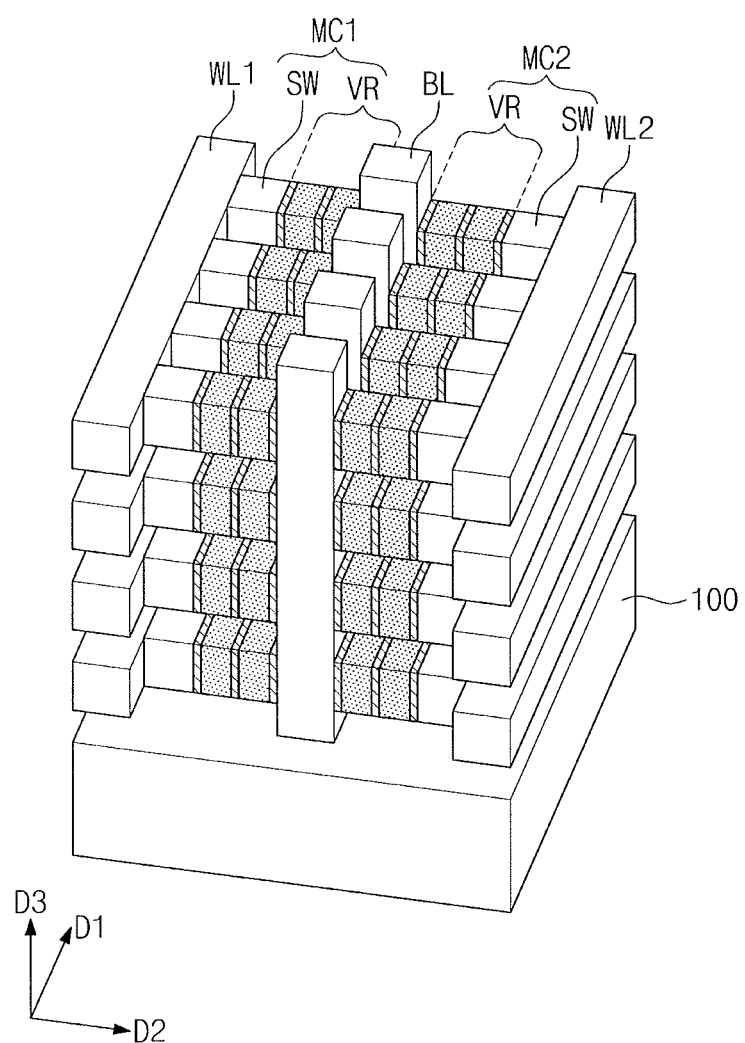
FIG. 1 illustrates a schematic perspective view of a three-dimensional semiconductor memory device according to example embodiments.

Various example embodiments will now be described more fully hereinafter with reference to the accompanying drawings. Like reference numerals may refer to like elements throughout this application.

FIG. 1 is a schematic perspective view illustrating a three-dimensional semiconductor memory device according to example embodiments.

Referring to FIG. 1, a three-dimensional (3D) semiconductor memory device may include a cross point memory cell array including memory cells MC1 and MC2 that are three dimensionally arranged on a substrate 100. The cross-point memory cell array may include word lines WL1 and WL2, bit lines BL crossing the word lines WL1 and WL2, and the memory cells MC1 and MC2 arranged at cross points between the word lines WL1 and WL2 and the bit lines BL.

The word lines WL1 and WL2 may include first word lines WL1 at first sides of the bit lines BL and second word lines WL2 at second sides of the bit lines BL opposite to the first sides of the bit lines BL. The first and second word lines WL1 and WL2 may extend along a first direction D1 parallel to an upper surface of the substrate 100. The first word lines WL1 may be stacked in a third direction D3 perpendicular to the upper surface of the substrate 100. The second word lines WL2 may be stacked in the third direction D3. The second word lines WL2 may be spaced apart from the first word lines WL1 in a second direction D2 with the bit lines BL therebetween. The second direction D2 may be parallel to the upper surface of the substrate 100 and may cross the first direction D1.

The bit lines BL may extend in the third direction D3 and may be arranged spaced apart from each other in the first direction D1. Although the bit lines BL exemplarily extend in the third direction D3 in the drawing, embodiments are not limited thereto. In some embodiments, the bit lines BL may extend in the first direction D1, and the word lines WL1 and WL2 may extend in the third direction D3.

The memory cells MC1 and MC2 may include first memory cells MC1 provided at cross points between the bit lines BL and the first word lines WL1 and second memory cells MC2 provided at cross points between the bit lines BL and the second word lines WL2.

Any of the first and second memory cells MC1 and MC2 may be selected by selected any of first and second word lines WL1 and WL2 and selected any of the bit lines BL. Adjacent ones of first memory cells MC1 and the second memory cells MC2 in the second direction D2 may share the respective bit lines BL. Each of the first and second memory cells MC1 and MC2 may include a variable resistance element VR and a switching element SW that are electrically connected in series. The variable resistance element VR and the switching element SW may be horizontally arranged along the second direction D2. Each of the first and second memory cells MC1 and MC2 may further include an electrode between the variable resistance element VR and the switching element SW.

The switching element SW may be a diode or an element based on a threshold switching phenomenon having a non-linear (e.g., an S-shape) I-V curve. For example, the switching element SW may be an ovonic threshold switch (OTS) element having a bi-directional characteristic.

The variable resistance element VR may include a material capable of storing information based on resistance variation. The variable resistance element VR may include a material capable of being changed to multiple states having different resistance values.

In some embodiments, the variable resistance element VR may include a phase change material capable of reversibly changing between a crystalline state and an amorphous state depending on temperature. The phase change material may have an amorphous state of relatively high resistance and a crystalline state of relatively low resistance, depending on temperature. For example, the phase change material may include a compound by combination of at least one of chalcogenide materials, such as Te or Se and at least one of Ge, Sb, Bi, Pb, Sn, Ag, As, S, Si, In, Ti, Ga, P, O and C. The phase change material may include, for example, at least one of GeSbTe, GeTeAs, SbTeSe, GeTe, SbTe, SeTeSn, GeTeSe, SbSeBi, GeBiTe, GeTeTi, InSe, GaTeSe, and InSbTe.

In some embodiments, the variable resistance element VR may have a superlattice structure in which a layer including Ge and a layer free of Ge are repeatedly and alternately stacked on each other. The variable resistance element VR may have a structure in which a GeTe layer and a SbTe layer are repeatedly and alternately stacked on each other.

In some embodiments, the variable resistance element VR may include a material of which a resistance value may vary by generation and disappearance of filaments and/or bridges. The variable resistance element VR may include, for example, a perovskite compound or a transition-metal oxide.

In some embodiments, the variable resistance element VR may include a magnetic tunnel junction in which a resistance value may vary depending on a magnetization direction between a free layer and a pinned layer.

In each of the first and second memory cells MC1 and MC2, the variable resistance element VR may include at least two variable resistance patterns and electrodes contacting the respective variable resistance patterns.

Each of the first memory cells MC1 may be symmetric with a corresponding one of the second memory cells MC2 with respect to a corresponding one of the bit lines BL. In some embodiments, the variable resistance elements VR of the first and second memory cells MC1 and MC2 may be connected in common to corresponding ones of the bit lines BL. The switching elements SW of the first memory cells MC1 may be connected to the first word lines WL1. The switching elements SW of the second memory cells MC2 may be connected to the second word lines WL2. In some embodiments, the switching elements SW of the first and second memory cells MC1 and MC2 may be commonly connected to corresponding ones of the bit lines BL and respectively connected to corresponding ones of the first and second word lines WL1 and WL2.

Figure 2:
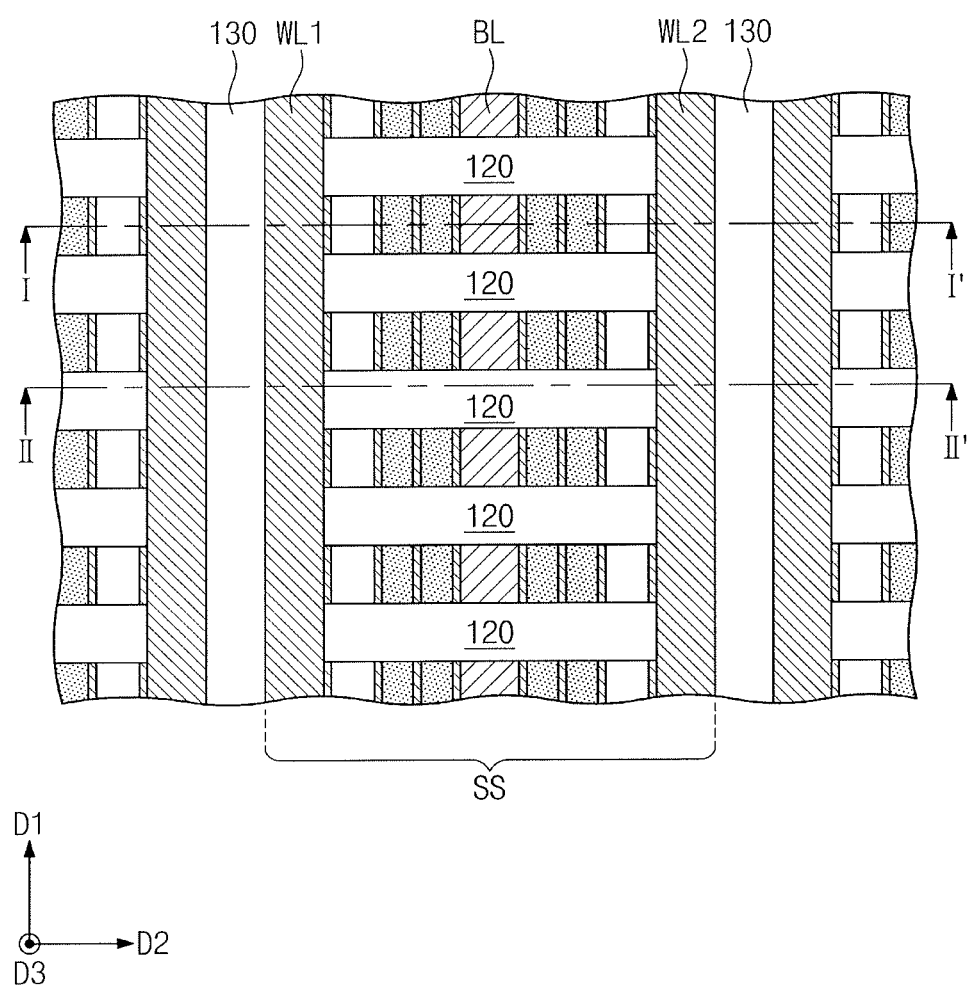
FIG. 2 illustrates a plan view of a three-dimensional semiconductor memory device according to example embodiments.
Figure 3A:
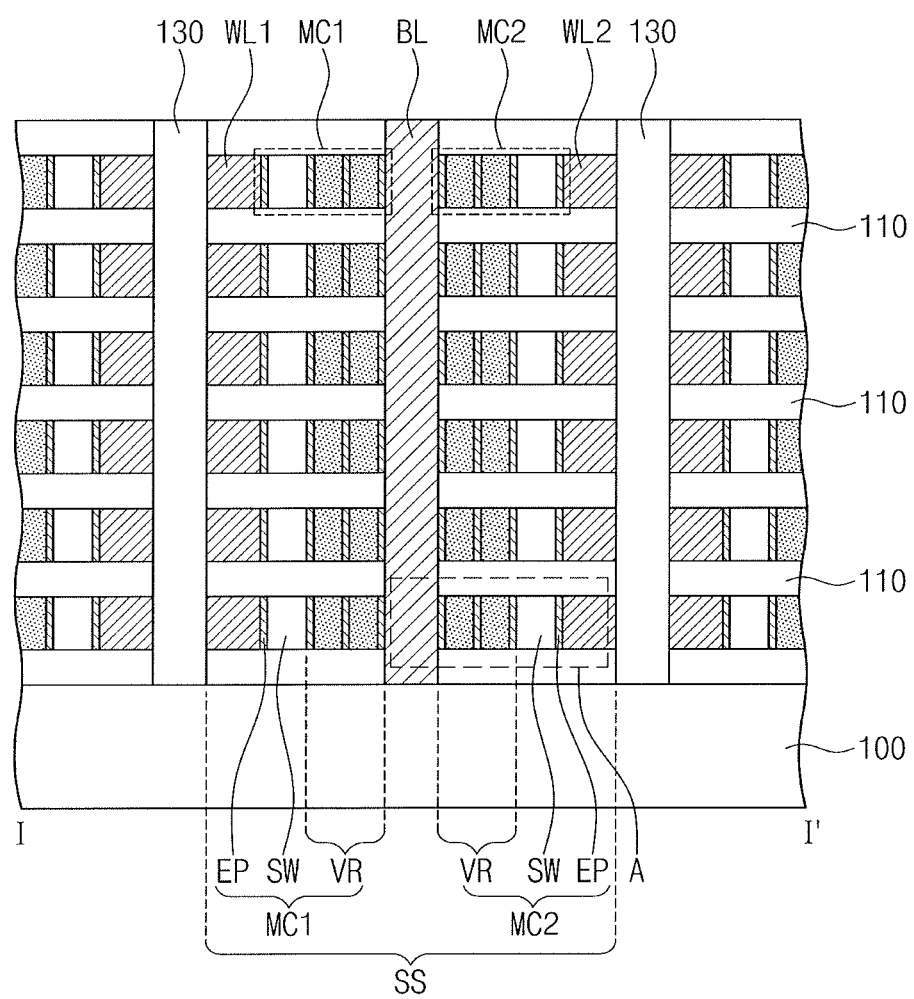
FIGS. 3A and 3B illustrate cross-sectional views taken along lines I-I' and II-II' of FIG. 2, respectively.
Figure 3B:
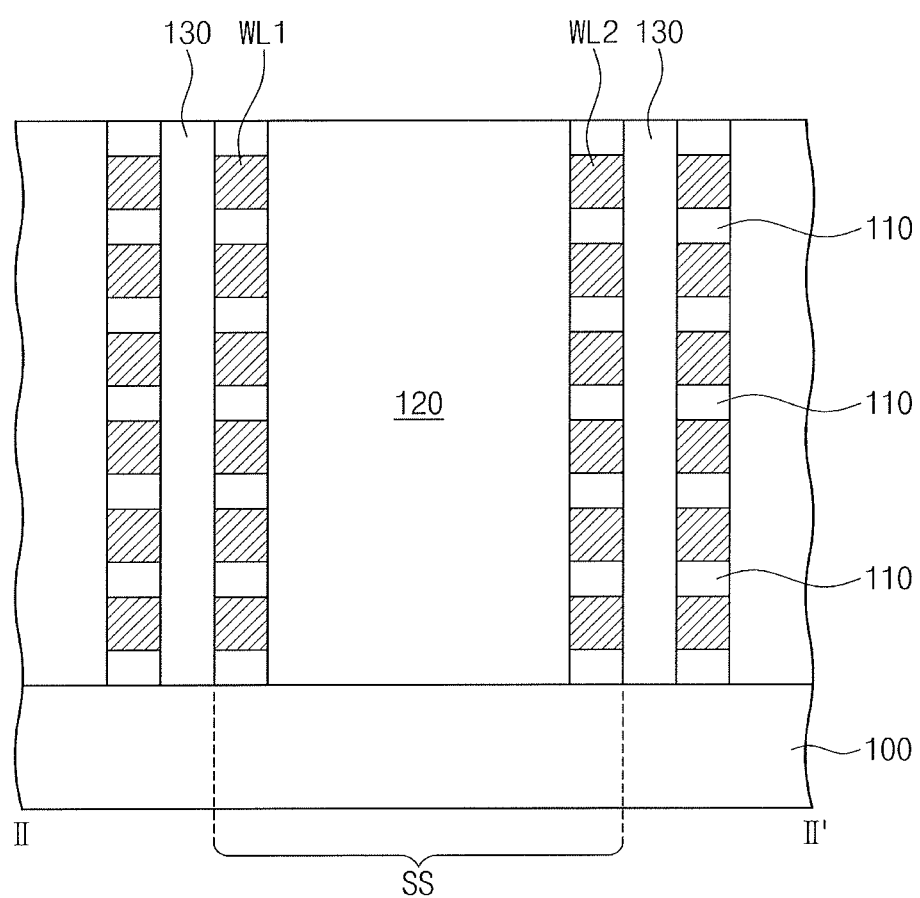
Figure 4:
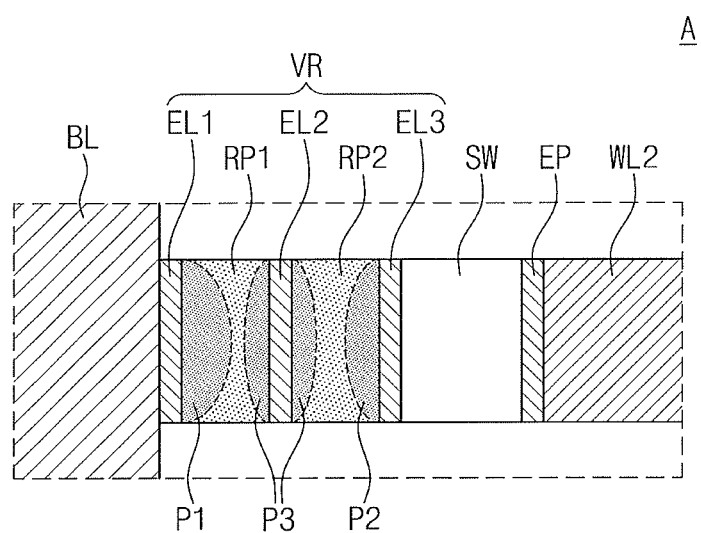
FIG. 4 illustrates an enlarged view of portion A of FIG. 3A.

FIG. 2 is a plan view illustrating a three-dimensional semiconductor memory device according to example embodiments. FIGS. 3A and 3B are cross-sectional views taken along lines I-I' and II-II', respectively, of FIG. 2. FIG. 4 is an enlarged view of portion A of FIG. 3A.

Referring to FIGS. 2, 3A, and 3B, a stack structure SS may be disposed on the substrate 100. The substrate 100 may include a semiconductor substrate. The substrate 100 may further include a thin layer disposed on the semiconductor substrate, but embodiments are not limited thereto. The stack structure SS may extend in the first direction D1.

Separation insulating patterns 130 may be disposed at opposite sides of the stack structure SS. The separation insulating patterns 130 may cover opposite sidewalls, respectively, of the stack structure SS. The separation insulating patterns 130 may extend in the first direction D1 and may be spaced apart from each other in the second direction D2 with the stack structure SS therebetween. The stack structure SS may be spaced apart from an adjacent stack structure SS with each of the separation insulating patterns 130 therebetween. Each of the separation insulating patterns 130 may include, for example, oxide, nitride, and/or oxynitride.

The stack structure SS may include insulation layers 110 and first conductive lines (i.e., word lines WL1 and WL2) that are alternately and repeatedly stacked on each other in the third direction D3. The first conductive lines may include the first word lines WL1 and the second word lines WL2. The first word lines WL1 and the second word lines WL2 may extend in the first direction D1. The first word lines WL1 and the second word lines WL2 may be spaced apart from each other in the second direction D2, on the respective insulation layers 110 and may be interposed between adjacent ones of the insulation layers 110 in the third direction D3. The first word lines WL1 may be vertically stacked and may be spaced apart from each other with each of the insulation layers 110 therebetween. The second word lines WL2 may be vertically stacked and may be spaced apart from each other with each of the insulation layers 110 therebetween. A lowermost one of the insulation layers 110 may be interposed between each of lowermost ones of the first and second word lines WL1 and WL2 and the substrate 100, but embodiments are not limited thereto.

One of the separation insulating patterns 130 may cover sidewalls of the first word lines WL1 and sidewalls of the insulation layers 110 interposed between the first word lines WL1. The other one of the separation insulating patterns 130 may cover sidewalls of the second word lines WL2 and sidewalls of the insulation layers 110 interposed between the second word lines WL2.

The stack structure SS may include second conductive lines (i.e., bit lines BL) between the first word lines WL1 and the second word lines WL2. The bit lines BL may extend from the upper surface of the substrate 100 in the third direction D3 and may be spaced apart from each other in the first direction D1. The bit lines BL may intersect the first and second word liners WL1 and WL2. Each of the bit lines BL may pass through the insulation layers 110. The first and second word lines WL1 and WL2 and the bit lines BL may include metal (e.g., copper, tungsten, or aluminum) and/or metal nitride (e.g., tantalum nitride, titanium nitride, or tungsten nitride). The insulation layers 110 may include, for example, silicon nitride.

The stack structure SS may include buried insulating patterns 120 between the first word lines WL1 and the second word lines WL2. The buried insulating patterns 120 may extend from the upper surface of the substrate 100 in the third direction D3 and may be spaced apart from each other in the first direction D1.

Each of the bit lines BL may be disposed between adjacent ones of the buried insulating patterns 120 in the first direction D1.

Each of the buried insulating patterns 120 may extend in the second direction D2 to contact the sidewalls of the first word lines WL1 and the sidewalls of the second word lines WL2. Each of the buried insulating patterns 120 may pass through the insulation layers 110. The buried insulating patterns 120 may include, for example, oxide, nitride, and/or oxynitride.

The stack structure SS may include the memory cells MC1 and MC2 provided at the cross points between the first and second word lines WL1 and WL2 and the bit lines BL. The memory cells MC1 and MC2 may include the first memory cells MC1 provided at the cross points between the first word lines WL1 and the bit lines BL and the second memory cells MC2 provided at the cross points between the second word lines WL2 and the bit lines BL.

The first memory cells MC1 may be spaced apart from each other in the first direction D1 and the third direction D3 between the first word lines WL1 and the bit lines BL. The first memory cells MC1 located at the same level may be connected to the respective bit lines BL and may be commonly connected to a corresponding one of the first word lines WL1. The first memory cells MC1 located at the same level may be separated from each other in the first direction D1 by the respective buried insulating patterns 120 therebetween. The first memory cells MC1 spaced apart from each other in the third direction D3 may be connected to the respective first word lines WL1 and may be commonly connected to a corresponding one of the bit lines BL. The first memory cells MC1 spaced apart from each other in the third direction D3 may be separated from each other by the respective insulation layers 110 therebetween.

The second memory cells MC2 may be spaced apart from each other in the first direction D1 and the third direction D3 between the second word lines WL2 and the bit lines BL. The second memory cells MC2 located at the same level may be connected to the respective bit lines BL and may be commonly connected to a corresponding one of the second word lines WL2. The second memory cells MC2 located at the same level may be separated from each other by the respective buried insulating patterns 120 therebetween. The second memory cells MC2 spaced apart from each other in the third direction D3 may be connected to the respective second word lines WL2 and may be commonly connected to a corresponding one of the bit lines BL. The second memory cells MC2 spaced apart from each other in the third direction D3 may be separated from each other by the respective insulation layers 110 therebetween. The second memory cells MC2 may be spaced apart from the first memory cells MC1 along the second direction D2.

Each of the first and second memory cells MC1 and MC2 may include the variable resistance element VR and the switching element SW as described with reference to FIG. 1. Each of the first and second memory cells MC1 and MC2 may be locally provided between a pair of buried insulating patterns 120 adjacent to each other in the first direction D1 and between a pair of insulation layers 110 adjacent to each other in the third direction D3.

The first memory cells MC1 may be arranged symmetric with the second memory cells MC2 with respect to the bit lines BL therebetween. For example, the variable resistance elements VR of the first and second memory cells MC1 and MC2 adjacent to each other in the second direction D2 may be commonly connected to a corresponding one of the bit lines BL, and the switching elements SW of the first and second memory cells MC1 and MC2 adjacent to each other in the second direction D2 may be connected to the first and second word lines WL1 and WL2, respectively. Alternatively, the switching elements SW of the first and second memory cells MC1 and MC2 adjacent to each other in the second direction D2 may be commonly connected to a corresponding one of the bit lines BL, and the variable resistance elements VR of the first and second memory cells MC1 and MC2 adjacent to each other in the second direction D2 may be connected to the first and second word lines WL1 and WL2, respectively.

More specifically, referring to FIGS. 3A and 4, each of the first and second memory cells MC1 and MC2 may include the switching element SW, an intermediate electrode EP between the switching element SW and the first or second word line WL1 or WL2, and the variable resistance element VR between the switching element SW and each of the bit lines BL.

The variable resistance element VR may include a first variable resistance pattern RP1 and a second variable resistance pattern RP2 that are arranged in the second direction D2, a first electrode EL1 between the first variable resistance pattern RP1 and each of the bit lines BL, a second electrode EL2 between the first variable resistance pattern RP1 and the second variable resistance pattern RP2, and a third electrode EL3 between the second variable resistance pattern RP2 and the switching element SW.

The first and second variable resistance patterns RP1 and RP2 may include at least one of materials having information storage characteristics. When the 3D semiconductor memory device according to example embodiments is a phase change memory device, the first and second variable resistance patterns RP1 and RP2 may include a material capable of reversible phase change between a crystalline state and an amorphous state depending on temperature. In some embodiments, in the first and second variable resistance patterns RP1 and RP2, a phase transition temperature between a crystalline state and an amorphous state may be between about 250° C. and about 350° C.

The first and second variable resistance patterns RP1 and RP2 may include a phase change material having the same chemical composition. In some embodiments, the first and second variable resistance patterns RP1 and RP2 may include phase change materials having different chemical compositions. In this case, the phase transition temperatures of the first and second variable resistance patterns RP1 and RP2 may differ from each other.

Each of the first and second variable resistance patterns RP1 and RP2 may include compound by combination of at least one of chalcogenide materials, such as Te or Se and at least one of Ge, Sb, Bi, Pb, Sn, Ag, As, S, Si, In, Ti, Ga, P, O and C. Each of the first and second variable resistance patterns RP1 and RP2 may include, for example, at least one of GeSbTe, GeTeAs, SbTeSe, GeTe, SbTe, SeTeSn, GeTeSe, SbSeBi, GeBiTe, GeTeTi, InSe, GaTeSe, and InSbTe.

In some embodiments, each of the first and second variable resistance patterns RP1 and RP2 may have a superlattice structure in which a layer including Ge and a layer free of Ge are repeatedly and alternately stacked on each other. For example, each of the first and second variable resistance patterns RP1 and RP2 may include a structure in which a GeTe layer and a SbTe layer are repeatedly and alternately stacked on each other.

The first to third electrodes EL1, EL2, and EL3 may include conductive materials having different resistivities. For example, a resistivity R1 of the first electrode EL1 may be greater than a resistivity of each of the second and third electrodes EL2 and EL3, the resistivity R3 of the second electrode EL2 may be smaller than the resistivity of each of the first and third electrodes EL1 and EL3, and the resistivity R2 of the third electrode EL3 may be smaller than the resistivity of the first electrode EL1 and greater than the resistivity of the second electrode EL2 (R1>R2>R3). In some embodiments, a resistivity of the second electrode EL2 may be greater than a resistivity of each of the first and second electrodes EL1 and EL2, and the resistivity of the first electrode EL1 may be smaller than the resistivity of each of the second and third electrodes EL2 and EL3.

In some embodiments, each of the first to third electrodes EL1, EL2, and EL3 may include a conductive material doped with an impurity. Impurity concentrations in the conductive materials of the first to third electrodes EL1, EL2, and EL3 may differ. The impurity doped in the first to third electrodes EL1, EL2, and EL3 may include, for example, at least one of boron (B), phosphorus (P), silicon (Si), germanium (Ge), and carbon (C).

In some embodiments, the impurity concentration in the first electrode EL1 may be greater than the impurity concentration in each of the second and third electrodes EL2 and EL3, and the impurity concentration in the second electrode EL2 may be greater than the impurity concentration in each of the first and third electrodes EL1 and EL3. For example, each of the first to third electrodes EL1, EL2, and EL3 may include at least one of W, Ti, Al, Cu, C, CN, TiN, TiAlN, TiSiN, TiCN, WN, CoSiN, WSiN, TaN, TaCN, and TaSiN. For example, each of the first to third electrodes EL1, EL2, and EL3 may include TiSiN, and silicon concentrations in the first to third electrodes EL1, EL2, and EL3 may be different from each other. For example, each of the first to third electrodes EL1, EL2, and EL3 may be a polysilicon pattern doped with an impurity, such as boron (B), silicon (Si), germanium (Ge), or carbon (C).

The switching element SW of each of the first and second memory cells MC1 and MC2 may be an ovonic threshold switch (OTS) element having a bidirectional characteristic. For example, the switching element SW may be an element based on a threshold switching phenomenon having a non-linear (e.g., S-shape) I-V curve. The switching element SW may have a phase transition temperature higher than that of each of the variable resistance patterns RP between the crystalline state and the amorphous state. For example, the phase transition temperature of the switching element SW may be between about 350° C. to about 450° C. Thus, during operation of the variable resistance memory device according to example embodiments, phases of the variable resistance patterns RP may be reversibly changed between the crystalline state and the amorphous state depending on an operation voltage, whereas the switching element SW may maintain a substantially amorphous state without phase change.

As used herein, the substantially amorphous state (or amorphous phase) does not exclude that a crystal boundary is locally present in a portion of an object or a locally crystallized portion is present in the object. The switching element SW may include a compound by combination of at least one of chalcogenide materials, such as Te or Se and at least one of Ge, Sb, Bi, Pb, Sn, Ag, As, S, Si, In, Ti, Ga, and P. The switching element SW may further include a thermal stabilization element in addition to the compound. The thermal stabilization element may include at least one of C, N, and O. For example, the switching element SW may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSb Se, GeAsBiTe, and GeAsBiSe.

In some embodiments, the switching element SW of each of the first and second memory cells MC1 and MC2 may be a diode. In this case, the switching element SW may include patterns with different conductivity types. For example, the switching element SW may be a silicon diode or an oxide diode which has a rectifying characteristic. The switching element SW may have a structure in which an n-type impurity doped semiconductor pattern and a p-type impurity doped semiconductor pattern are joined. Alternatively, the switching element SW may be an oxide diode in which P-NiOx and N-PiOx are joined or P-CuOx and N-TiOx are joined.

The intermediate electrode EP between the switching element SW and the first or second word line WL1 or WL2 may include, for example, at least one of W, Ti, Al, Cu, C, CN, TiN, TiAlN, TiSiN, TiCN, WN, CoSiN, WSiN, TaN, TaCN, and TaSiN.

When a program current flows in the first or second memory cell MC1 or MC2 between the bit line BL and the first or second word line WL1 or WL2, joule heat may be generated at interfaces between the first and second variable resistance patterns RP1 and RP2 and the first to third electrodes ELL EL2, and EL3. The joule heat may convert portions of the first or second variable resistance pattern RP1 or RP2 adjacent to the first to third electrodes ELL EL2, and EL3 to an amorphous state or a crystalline state.

Since the first to third electrodes ELL EL2, and EL3 are formed of the materials with different resistivities, when the program current flows in the variable resistance element VR, volumes of phase change portions P1, P2, and P3 may differ. The variable resistance element VR may have any of four resistance levels based on the program current.

As an example, when a first program current flows in the variable resistance element VR, the portion P1 of the first variable resistance pattern RP1 adjacent to the first electrode EL1 having the greatest resistivity may be phase-changed. Thereafter, when a second program current having a current intensity greater than that of the first program current flows in the variable resistance element VR, the portion P2 of the second variable resistance pattern RP2 adjacent to the third electrode EL3 may be phase-changed. At the same time, the volume of the phase change portion P1 in the first variable resistance pattern RP1 may increase. Thereafter, when a third program voltage having a current intensity greater than that of the second program current flows in the variable resistance element VR, the portions P3 of the first and second variable resistance patterns RP1 and RP2 adjacent to the second electrode EL2 having the smallest resistivity may be phase-changed. At the same time, volumes of the phase change portions P1 and P2 in the first and second variable resistance patterns RP1 and RP2 may increase.

Figure 5:
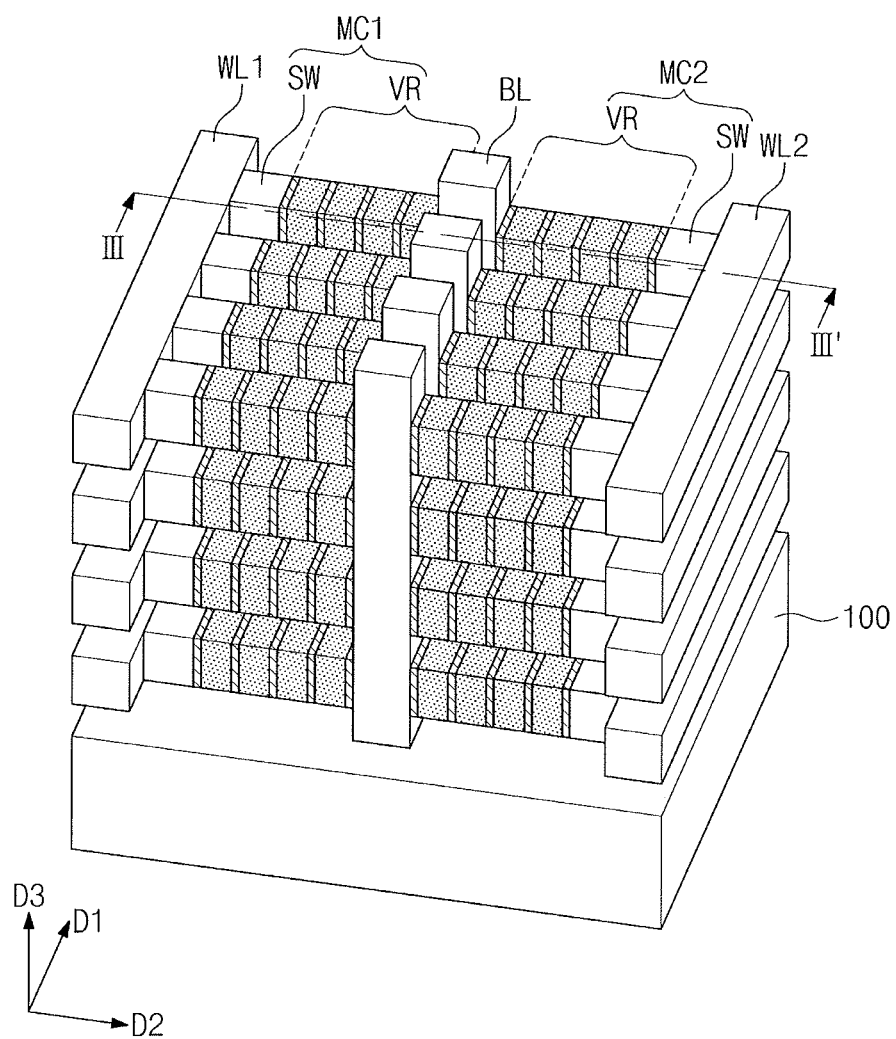
FIG. 5 illustrates a schematic perspective view of a three-dimensional semiconductor memory device according to example embodiments.
Figure 6:
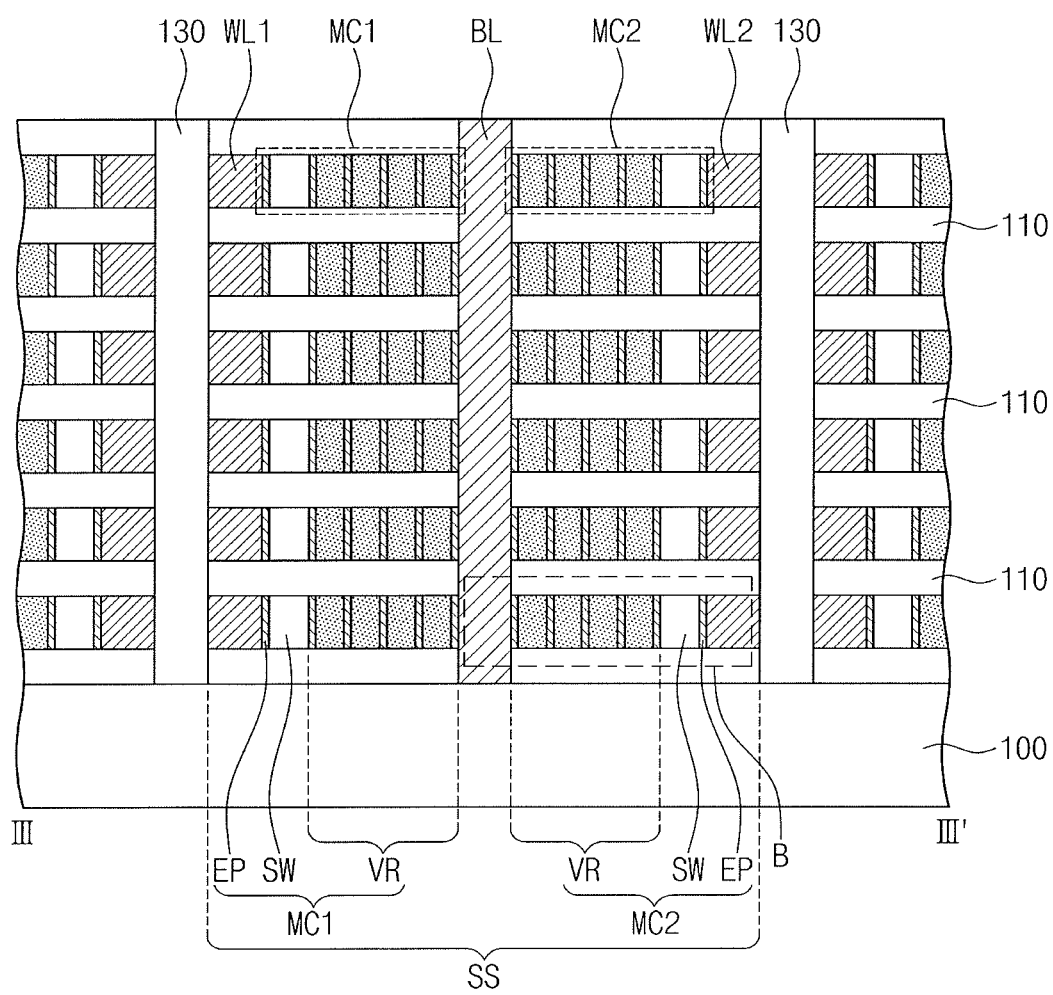
FIG. 6 illustrates a cross-sectional view taken along line III-III' of FIG. 5.
Figure 7:
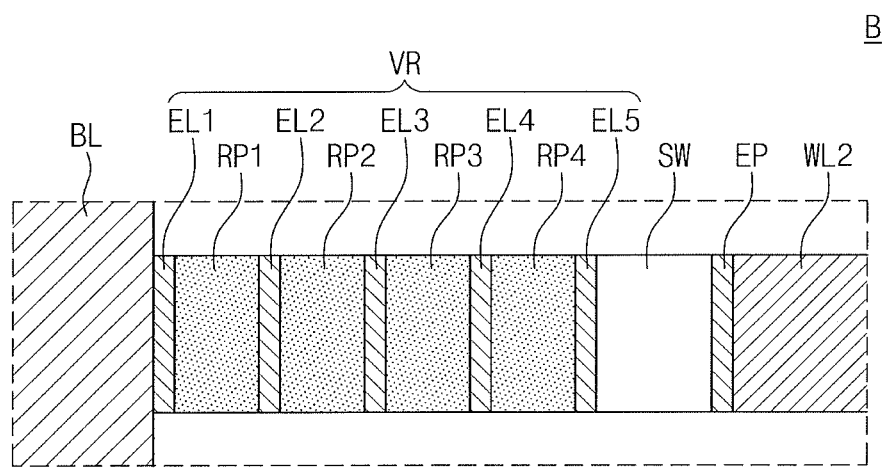
FIG. 7 illustrates an enlarged view of portion B of FIG. 6.

FIG. 5 is a schematic perspective view illustrating a three-dimensional semiconductor memory device according to example embodiments. FIG. 6 is a cross-sectional view taken along line III-III' of FIG. 5, illustrating a three-dimensional semiconductor memory device according to example embodiments. FIG. 7 is an enlarged view of portion B of FIG. 6.

For convenience of explanation, descriptions of the same technical configurations as described with reference to FIGS. 2, 3A, and 3B are omitted.

Referring to FIGS. 5 and 6, as described above, the respective first memory cells MC1 may be symmetric with the respective second memory cells MC2 with respect to corresponding ones of the bit lines BL.

As an example, the variable resistance elements VR of the first and second memory cells MC1 and MC2 may be commonly connected to corresponding ones of the bit lines BL. The switching elements SW of the first memory cells MC1 may be connected to the first word lines WL1. The switching elements SW of the second memory cells MC2 may be connected to the second word lines WL2.

In each of the first and second memory cells MC1 and MC2, the variable resistance element VR may include at least three variable resistance patterns and electrodes contacting the respective variable resistance patterns.

Specifically, each of the first and second memory cells MC1 and MC2 may include the switching element SW, the intermediate electrode EP between the switching element SW and the first or second word line WL1 or WL2, and the variable resistance element VR between the switching element SW and the bit line BL. Here, the variable resistance element VR may include first, second, third, and fourth variable resistance patterns RP1, RP2, RP3, and RP4 that are sequentially arranged in the second direction D2, the first electrode EL1 between the first variable resistance pattern RP1 and the bit line BL, the second electrode EL2 between the first variable resistance pattern RP1 and the second variable resistance pattern RP2, the third electrode EL3 between the second variable resistance pattern RP2 and the third variable resistance pattern RP3, and a fourth electrode EL4 between the third variable resistance pattern RP3 and the fourth variable resistance pattern RP4, and a fifth electrode EL5 between the fourth variable resistance pattern RP4 and the switching element SW.

The first to fifth electrodes EL~EL5 may include conductive materials having different resistivities. Thus, when program current flows in the variable resistance element VR, the order of portions which are phase-changed may vary depending on the resistivities of the first to fifth electrodes EL~EL5

As an example, the resistivity R1 of the first electrode EL1 may be greater than the resistivity of each of the second to fifth electrodes EL2~EL5. The resistivity R5 of the second electrode EL2 may be smaller than the resistivity of each of the first, third, fourth, and fifth electrodes EL1, EL3, EL4, and EL5. The resistivity R3 of the third electrode EL3 may be smaller than the resistivity of the first electrode EL1 and greater than the resistivity of the second electrode EL2. The resistivity R2 of the fourth electrode EL4 may be smaller than the resistivity of the first electrode EL1 and greater than the resistivity of the third electrode EL3. The resistivity R4 of the fifth electrode EL5 may be smaller than the resistivity of the third electrode EL3 and greater than the resistivity of the second electrode EL2. (R1>R2>R3>R4>R5)

In this case, when the program current flowing in the variable resistance element VR sequentially increases, phase changes may be generated in the first to fourth variable resistance patterns RP1~RP4 in order adjacent to the first electrode EL1, the fourth electrode EL4, the third electrode EL3, the fifth electrode EL5, and the second electrode EL2

Figure 8:
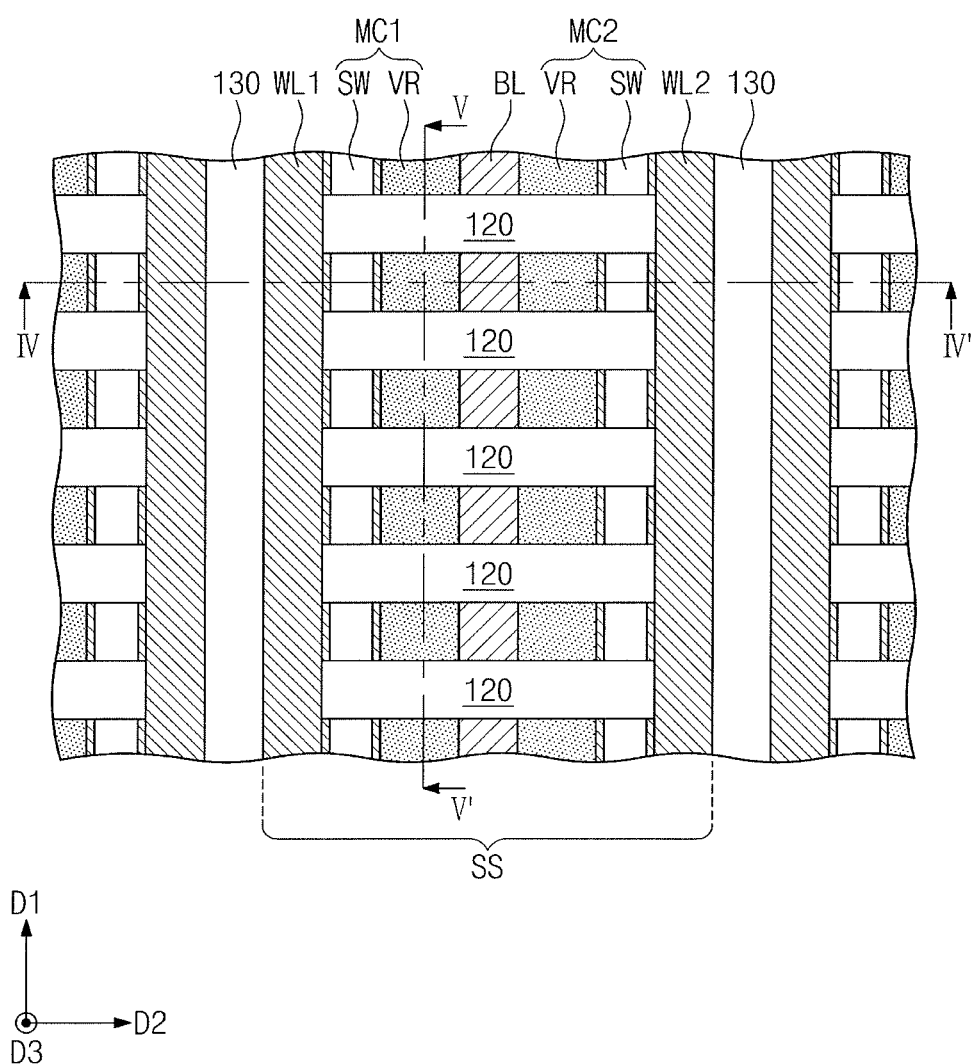
FIG. 8 illustrates a plan view of a three-dimensional semiconductor memory device according to example embodiments.
Figure 9A:
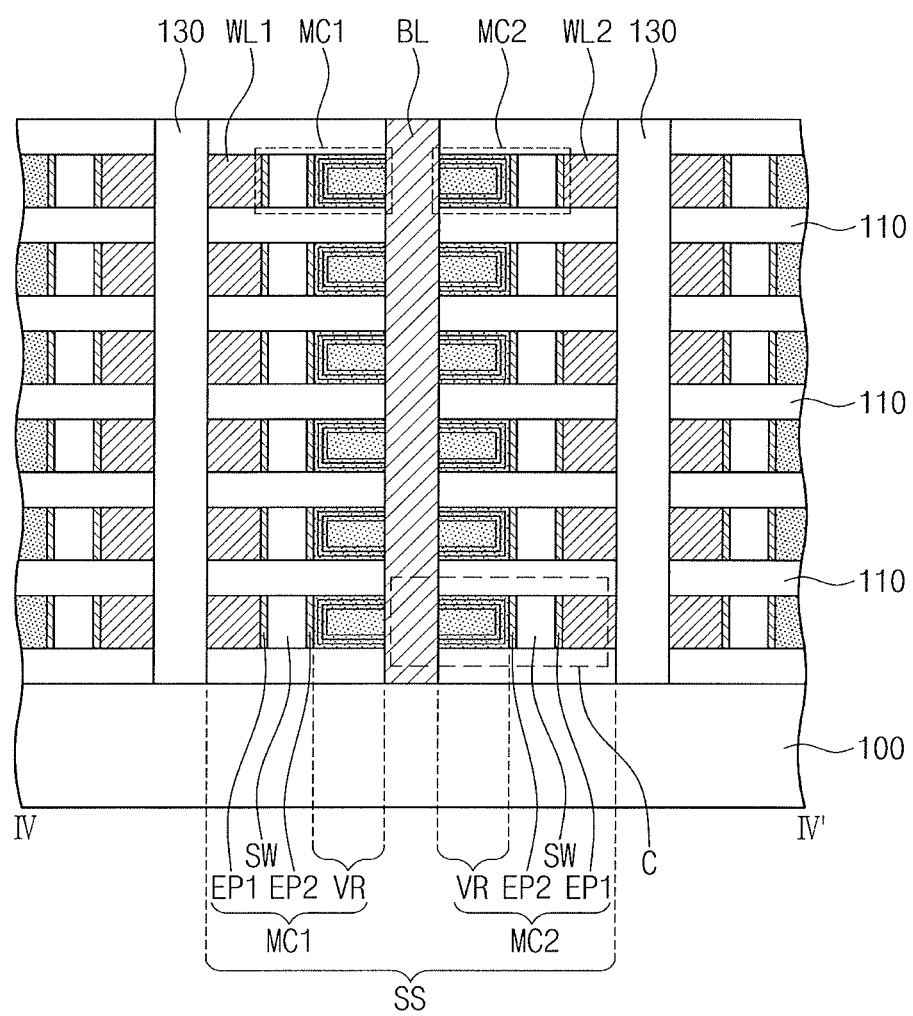
FIGS. 9A and 9B illustrate cross-sectional views taken along lines IV-IV' and V-V' of FIG. 8, respectively.
Figure 9B:
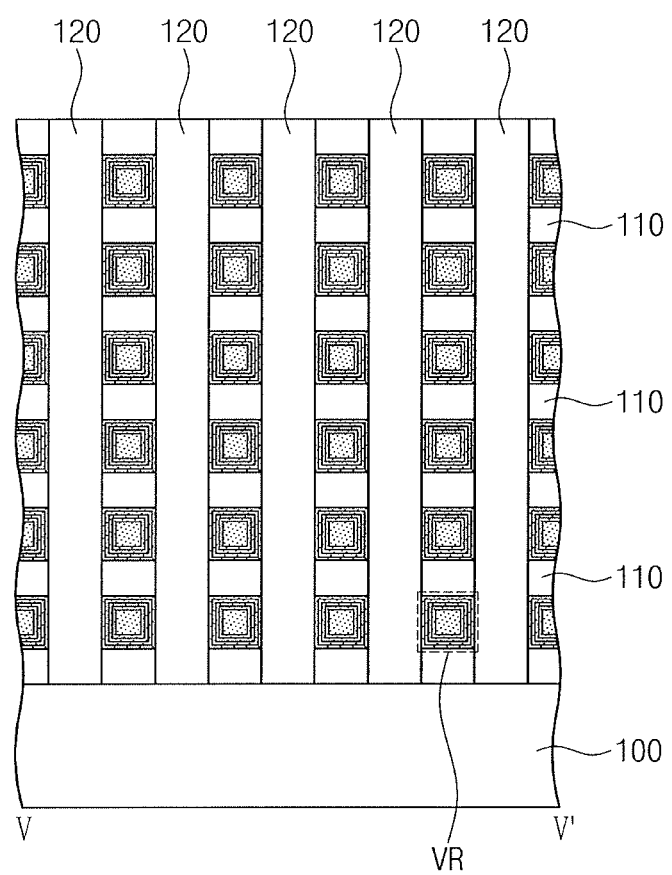

FIG. 8 is a plan view illustrating a three-dimensional semiconductor memory device according to example embodiments. FIGS. 9A and 9B are cross-sectional views taken along lines IV-IV' and V-V', respectively, of FIG. 8, illustrating a three-dimensional semiconductor memory device according to example embodiments. FIGS. 10A, 10B, 10C, and 10D are enlarged views of portion C of FIG. 9A.

For convenience of explanation, descriptions of the same technical configurations as described with reference to FIGS. 2, 3A, and 3B are omitted.

Referring to FIGS. 8, 9A, and 9B, the bit lines BL may be disposed between the first word lines WL1 and the second word lines WL2. The first memory cells MC1 may be provided at the cross-points between the first word lines WL1 and the bit lines BL. The second memory cells MC2 may be provided at the cross-points between the second word lines WL2 and the bit lines BL.

Each of the first and second memory cells MCI and MC2 may include the switching element SW, a first intermediate electrode EP1 between the switching element SW and the first or second word line WL1 or WL2, the variable resistance element VR between the switching element SW and the bit line BL, and a second intermediate electrode EP2 between the variable resistance element VR and the switching element SW.

The switching element SW may be disposed between the variable resistance element VR and the first or second word line WL1 or WL2. The variable resistance element VR may be disposed between the bit line BL and the switching element SW. The variable resistance element VR may include a plurality of variable resistance patterns RP. Sidewalls of the variable resistance patterns RP may commonly contact a corresponding one of the bit lines BL.

Specifically, referring to FIGS. 10A to 10D, the variable resistance element VR may include first to fourth variable resistance patterns RP1~RP4 that are arranged in order along the second direction D2. As an example, the first variable resistance pattern RP1 may be adjacent to the switching element SW (or the first word line WL1 or the second word line WL2).

Each of the first to third variable resistance elements RP1~RP3 may include a sidewall portion VP adjacent to a sidewall of the first word line WL1 or the second word line WL2 and horizontal portions HP extending in the second direction D2 from opposite ends of the sidewall portion VP. As an example, the sidewall portions VP of the first to third variable resistance patterns RP1~RP3 may extend parallel to the third direction D3. The sidewall portion VP of the first variable resistance pattern RP1 may contact the second electrode EP2 between the switching element SW and the variable resistance element VR. Furthermore, the horizontal portions HP of each of the first to third variable resistance patterns RP1~RP3 may include first horizontal portions parallel to the upper surface and the lower surface of corresponding ones of the insulation layers 110 and second horizontal portions parallel to sidewalls of corresponding ones of the buried insulating patterns 120, as shown in FIG. 9B.

The fourth variable resistance pattern RP4 may fill a space defined by the sidewall portion VP and the horizontal portions HP of the third variable resistance pattern RP3. Alternatively, the fourth variable resistance pattern RP4 may include a sidewall portion VP and horizontal potions HP, similar to the first to third variable resistance patterns RP1~RP3.

One sidewalls of the horizontal portions HP of the first to fourth variable resistance patterns RP1~RP4 may be vertically aligned. As an example, one sidewalls of the horizontal portions HP of the first to fourth variable resistance patterns RP1~RP4 may contact the bit line BL.

Figure 10A:
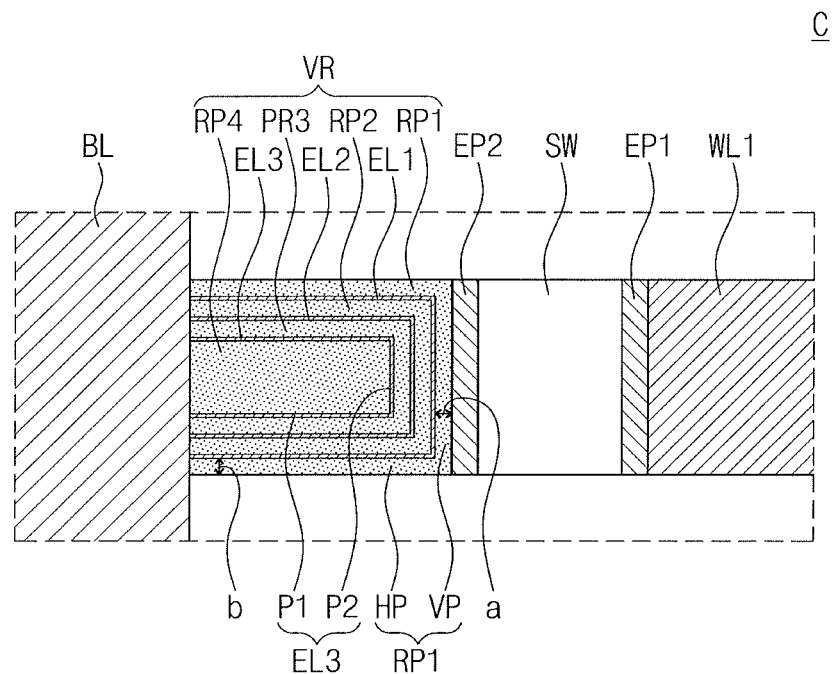
FIGS. 10A, 10B, 10C, and 10D illustrate enlarged views of portion C of FIG. 9A.

As an example, referring to FIG. 10A, in each of the first to third variable resistance patterns RP1~RP3, a thickness a of the sidewall portion VP in the second direction D2 (i.e., the horizontal direction) may be substantially the same as a thickness b of each of the horizontal portions HP in the third direction D3 (i.e., the vertical direction). In some embodiments, referring to FIG. 10B, the thickness a of the sidewall portion VP may be different from the thickness b of each of the horizontal portions HP. For example, the thickness a of the sidewall portion VP may be greater than the thickness b of each of the horizontal portions HP.

Figure 10B:
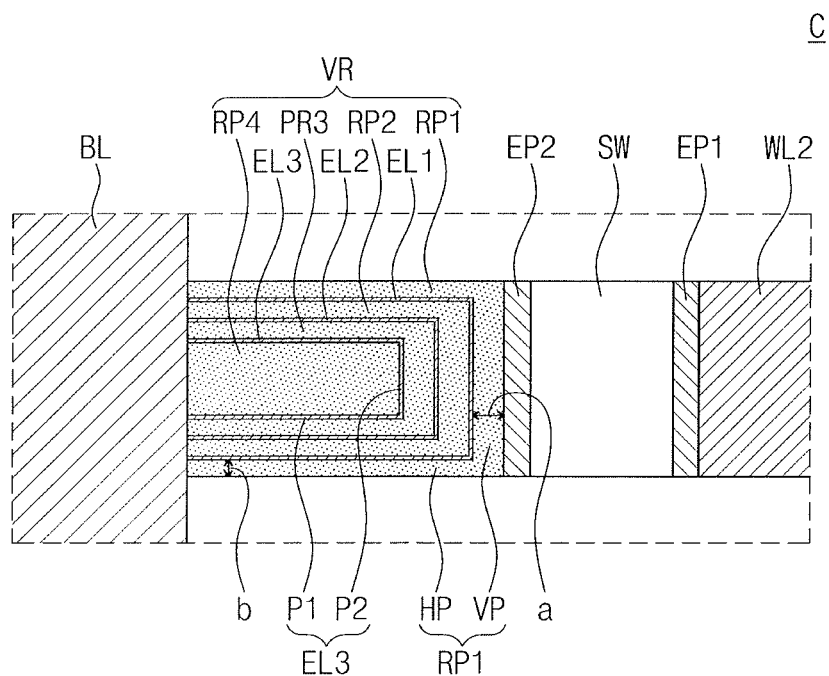

Referring to FIGS. 10A and 10B, the variable resistance element VR may include the first to third electrodes ELL EL2, and EL3 between the respective ones of the first to fourth variable resistance patterns RP1~RP4 that are respectively arranged in order. In this case, the first to third electrodes ELL EL2, and EL3 may include conductive materials having different resistivities. As described above, the resistivity R1 of the first electrode EL1 may be greater than the resistivity of each of the second and third electrodes EL2 and EL3, and the resistivity R3 of the second electrode EL2 may be smaller than the resistivity of each of the first and third electrodes EL1 and EL3. The resistivity R2 of the third electrode EL3 may be smaller than the resistivity of the first electrode EL1 and greater than the resistivity of the second electrode EL2.

Each of the first to third electrodes EL1, EL2, and EL3 may include first portions P1 contacting the horizontal portions HP of each of the first to third variable resistance patterns RP1~RP3 and a second portion P2 extending from the first portions P1 and contacting the sidewall portion VP. Each of the first to third electrodes EL1, EL2, and EL3 may have a substantially uniform thickness in the first portions P1 and the second portions P2. For example, each of the first to third electrodes EL1, EL2, and EL3 may have a thickness of 3 Å to 100 Å.

One sidewalls of the first portions P1 of the first to third electrodes EL1, EL2, and EL3 may be vertically aligned. For example, one sidewalls of the first portions P2 of the first to third electrodes EL1, EL2, and EL3 may contact one sidewall of the bit line BL.

Each of the first to third electrodes EL1, EL2, and EL3 may include a conductive material having an anisotropic current characteristic. When a predetermined voltage is applied to each of the first to third electrodes EL1, EL2, and EL3, a current characteristic thereof in the second direction D2 may be different from a current characteristic thereof in the third direction D3. For example, in each of the first to third electrodes EL1, EL2, and EL3, a current amount flowing in the second direction D2 may be larger than a current amount flowing in the third direction D3.

Accordingly, when the program current flows in the variable resistance element VR, the phase change may be generated in the sidewall portions VP of the first to fourth variable resistance patterns RP1~RP4. That is, during the program operation, each of the sidewall portions VP of the first to fourth variable resistance patterns RP1~RP4 may include a phase change portion. As an example, each of the first to third electrodes EL1, EL2, and EL3 may include a material having an anisotropic resistance characteristic depending on a current direction. That is, in each of the first to third electrodes EL1, EL2, and EL3, the first portions P1 and the second portion P2 may have different resistivities. For example, the resistivity difference between the first portions P1 and the second portion P2 may be more than about 5 times. Each of the first to third electrodes EL1, EL2, and EL3 may have the resistivity of at least 20 uΩ.cm. For example, each of the first to third electrodes EL1, EL2, and EL3 may have the resistivity of 20 uΩ.cm to 20 Ω.cm. In some embodiments, in each of the first to third electrodes EL1, EL2, and EL3, a crystal size of each of the first portions P1 and a crystal size of the second portion P2 may differ. Each of the first to third electrodes EL1, EL2, and EL3 may include a conductive polymer material having the anisotropic resistance characteristic, and may include, for example, $TiO_2$.

In some embodiments, each of the first to third electrodes EL1, EL2, and EL3 may include a conductive material doped with an impurity. Impurity concentrations in the conductive materials of the first to third electrodes EL1, EL2, and EL3 may differ.

Figure 10C:
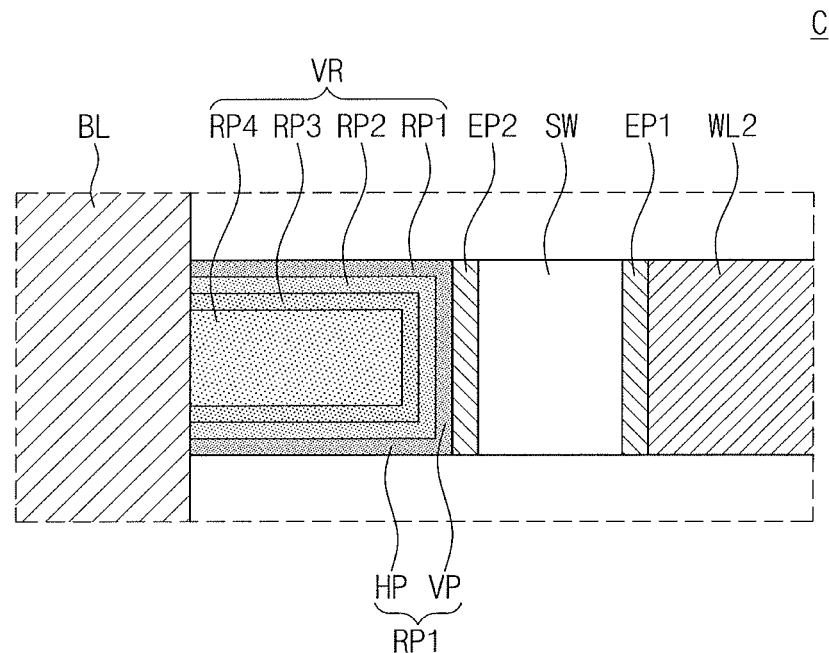

Referring to FIG. 10C, the first to fourth variable resistance patterns RP1~RP4 may include different phase change materials. For example, the first variable resistance pattern RP1 may include a first phase change material, the second variable resistance pattern RP2 may include a second phase change material, the third variable resistance pattern RP3 may include a third phase change material, and the fourth variable resistance pattern RP4 may include a fourth phase change material.

As an example, the first to fourth variable resistance patterns RP1~RP4 may include chalcogenide materials having different compositions. Phase transition temperatures at which the first to fourth phase change materials are converted to an amorphous state or a crystalline state may differ.

Figure 10D:
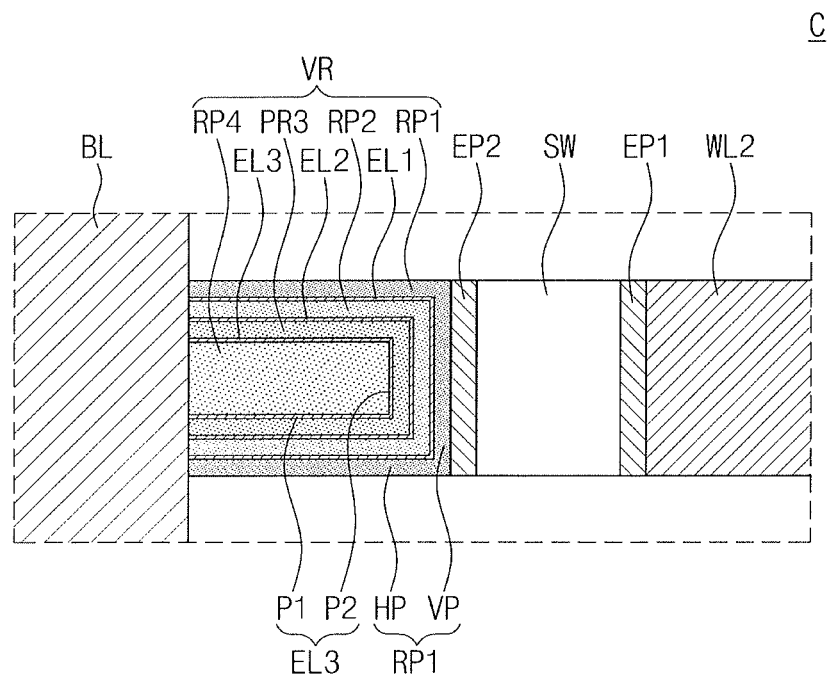

Referring to FIG. 10D, the first to fourth variable resistance patterns RP1~RP4 may include different phase change materials, and the first to third electrodes EL1, EL2, and EL3 may be respectively interposed between the first to fourth variable resistance patterns RP1~RP4. In this case, the first to third electrodes EL1, EL2, and EL3 may include conductive materials having different resistivities.

Figure 11:
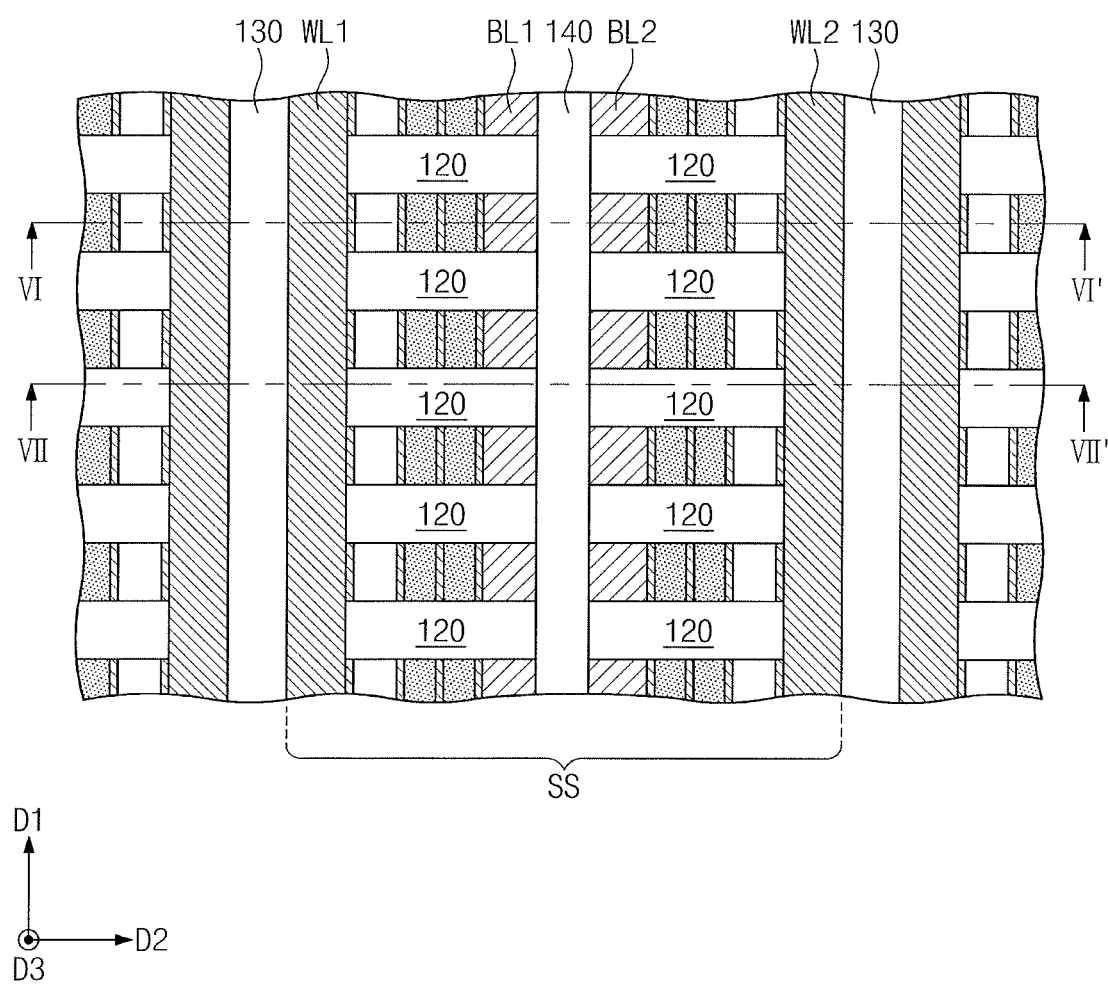
FIG. 11 illustrates a plan view of a three-dimensional semiconductor memory device according to example embodiments.
Figure 12A:
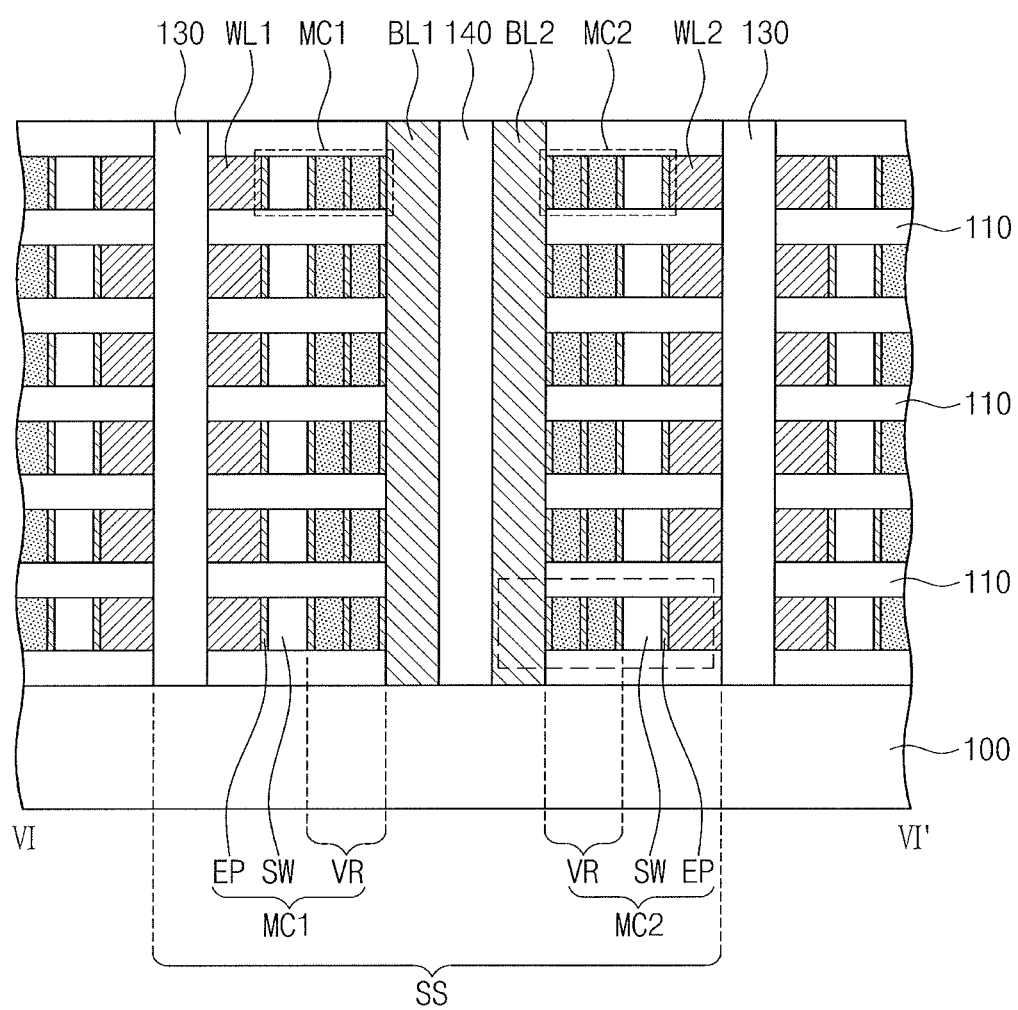
FIGS. 12A and 12B illustrate cross-sectional views taken along lines VI-VI' and VII-VII' of FIG. 11, respectively.
Figure 12B:
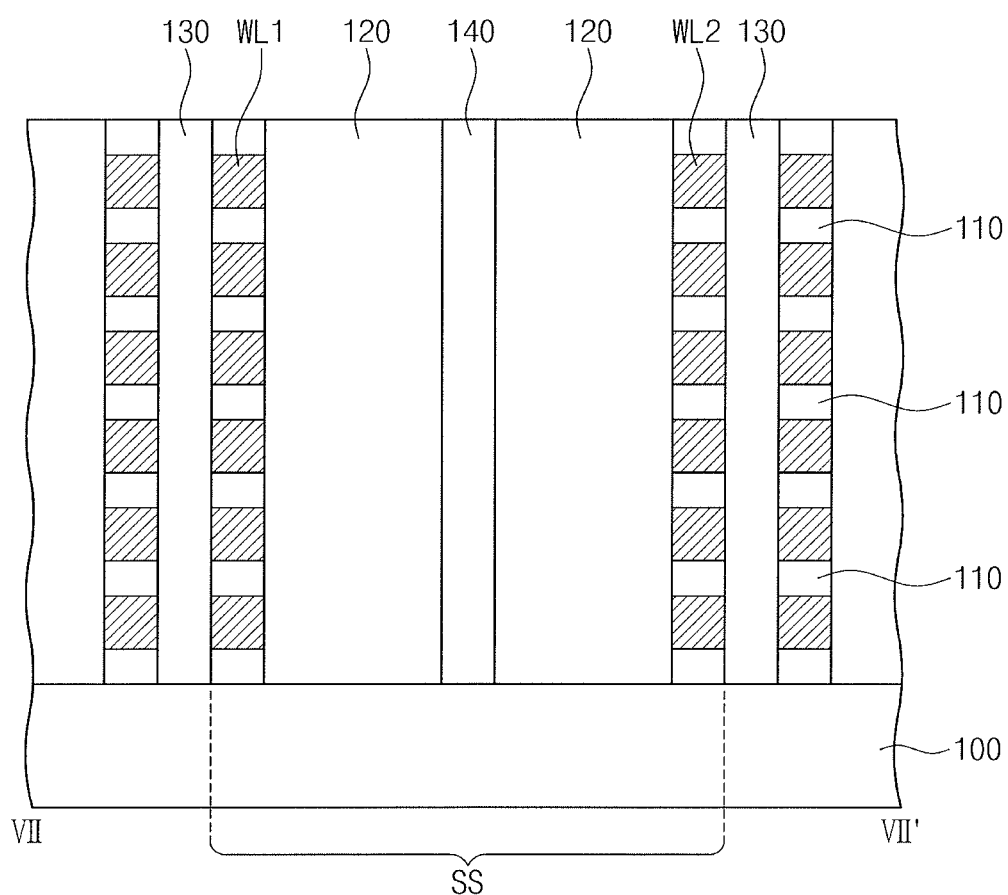

FIG. 11 is a plan view illustrating a three-dimensional semiconductor memory device according to example embodiments. FIGS. 12A and 12B are cross-sectional views taken along lines VI-VI' and VII-VII', respectively, of FIG. 11, illustrating a three-dimensional semiconductor memory device according to example embodiments.

For convenience of explanation, descriptions of the same technical configurations as described with reference to FIGS. 2, 3A, and 3B are omitted.

Referring to FIGS. 11, 12A, and 12B, the first word lines WL1 and the second word lines WL2 may be disposed between a pair of first separation insulating patterns 130. A pair of bit lines BL may be disposed between the first word lines WL1 and the second word lines WL2.

The first bit lines BL1 may be arranged spaced apart from each other in the first direction D1. The second bit lines BL2 may be arranged spaced apart from each other in the first direction D1. The first bit lines BL1 may be spaced apart from the second bit lines BL2 in the second direction D2 by a second separation insulating pattern 140.

The first bit lines BL may extend in the third direction D3. The second bit lines BL may extend in the third direction D3.

The second separation insulating pattern 140 may extend in the first direction D1 and may be disposed between the first and second bit lines BL1 and BL2.

FIGS. 13A, 13B, 14A, 14B, 15A, 15B, 16, 17, and 18 are cross-sectional views illustrating a method of manufacturing a three-dimensional semiconductor device according to example embodiments. FIGS. 13A, 14A, 15A, 16, 17, and 18 are cross-sectional views taken along line I-I' of FIG. 2, and FIGS. 13B, 14B, and 15B are cross-sectional views taken along line II-II' of FIG. 2.

Figure 13A:
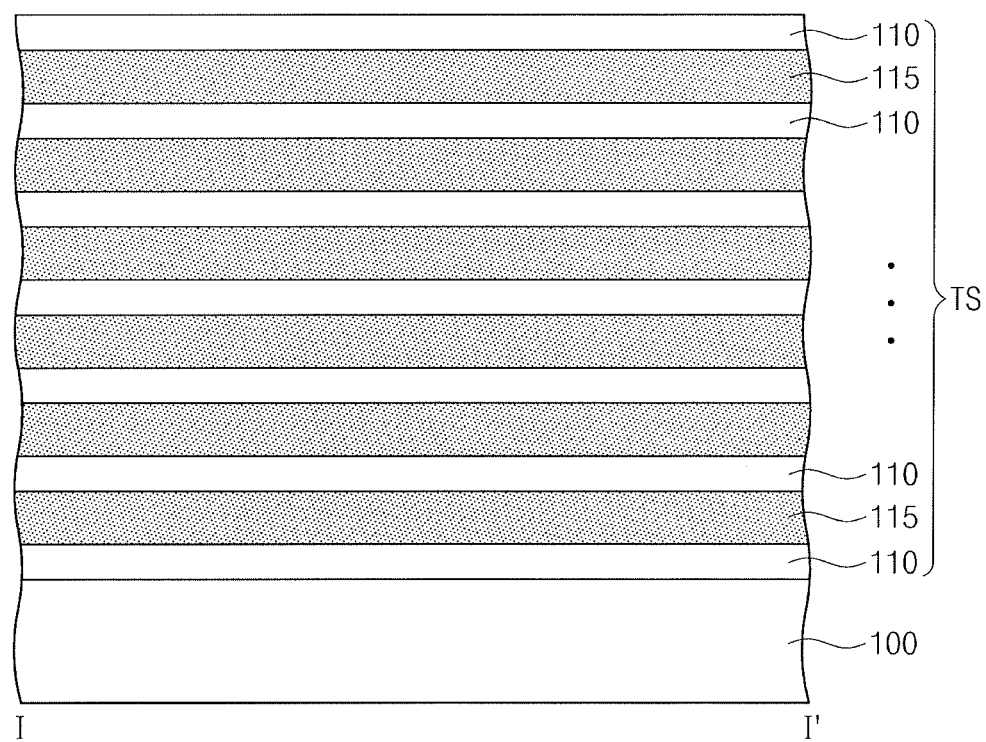
FIGS. 13A, 13B, 14A, 14B, 15A, 15B, 16, 17, and 18 illustrate cross-sectional views of stages in a method of manufacturing a three-dimensional semiconductor device according to example embodiments.
Figure 13B:
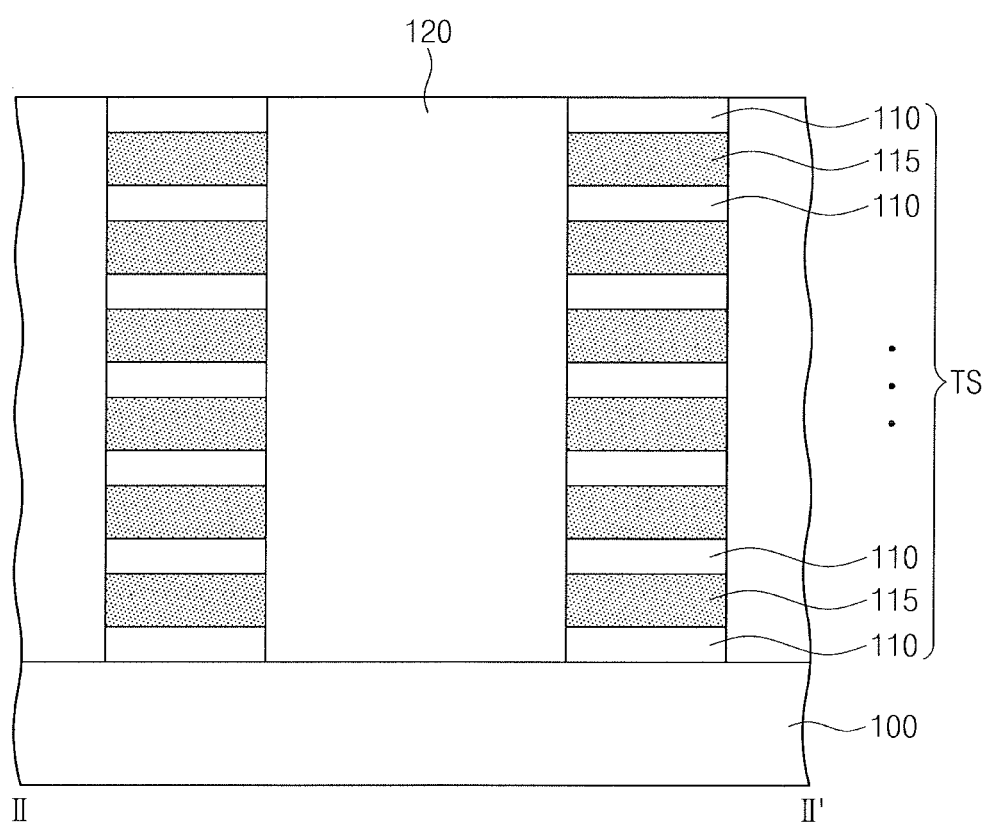

Referring to FIGS. 2, 13A, and 13B, a thin structure TS may be formed on the substrate 100. The thin structure TS may include the insulation layers 110 and sacrificial layers 115 that are stacked on an upper surface of the substrate 100. The insulation layers 110 and sacrificial layers 115 may be alternately and repeatedly stacked on each other in the third direction D3. A lowermost one of the insulation layers 110 may be interposed between a lowermost one of the sacrificial layers 115 and the substrate 100, but embodiments are not limited thereto.

The insulation layers 110 may include, for example, silicon nitride or silicon oxide. The sacrificial layers 115 may include a material having an etch selectivity with respect to the insulation layers 110. For example, the sacrificial layers 115 may include an impurity doped silicon or an impurity doped metal oxide. In some embodiment, the sacrificial layers 115 may include a chalcogenide material. The sacrificial layers 115 may include a compound by combination of at least one of chalcogenide materials, such as Te or Se and at least one of Ge, Sb, Bi, Pb, Sn, Ag, As, S, Si, In, Ti, Ga, and P. The sacrificial layers 115 may include an impurity (e.g., at least one of C, N, B, and O).

The buried insulating patterns 120 may be formed in the thin structure TS. The buried insulating patterns 120 may be spaced apart from each other in the first direction D1 in the thin structure TS and may extend in the second direction D2. Each of the buried insulating patterns 120 may pass through the thin structure TS to contact the upper surface of the substrate 100.

The buried insulating patterns 120 may be formed by, for example, forming through holes passing through the thin structure TS, forming a buried insulating layer on the thin structure TS to fill the through holes, and planarizing the buried insulating layer until an upper surface of the thin structure TS is exposed. The through holes may be formed by, for example, forming a mask pattern on the thin structure TS to define a region in which the buried insulating patterns 120 are to be formed and etching the thin structure TS using the mask pattern as an etch mask. The through holes may be spaced apart from each other in the first direction D1. Each of the through holes may have a linear shape extending in the second direction D2, and may expose the upper surface of the substrate 100. As the buried insulating layer is planarized, the buried insulating patterns 120 may be locally formed in the through holes. The buried insulating patterns 120 may include, for example, oxide, nitride, and/or oxynitride.

Figure 14A:
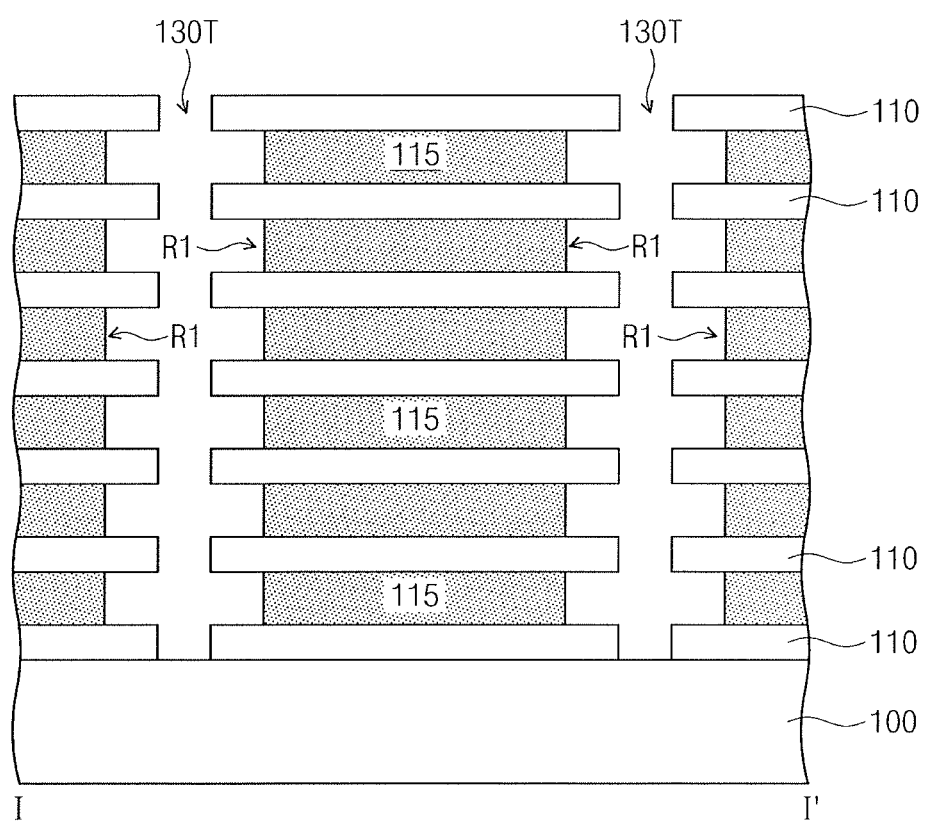
Figure 14B:
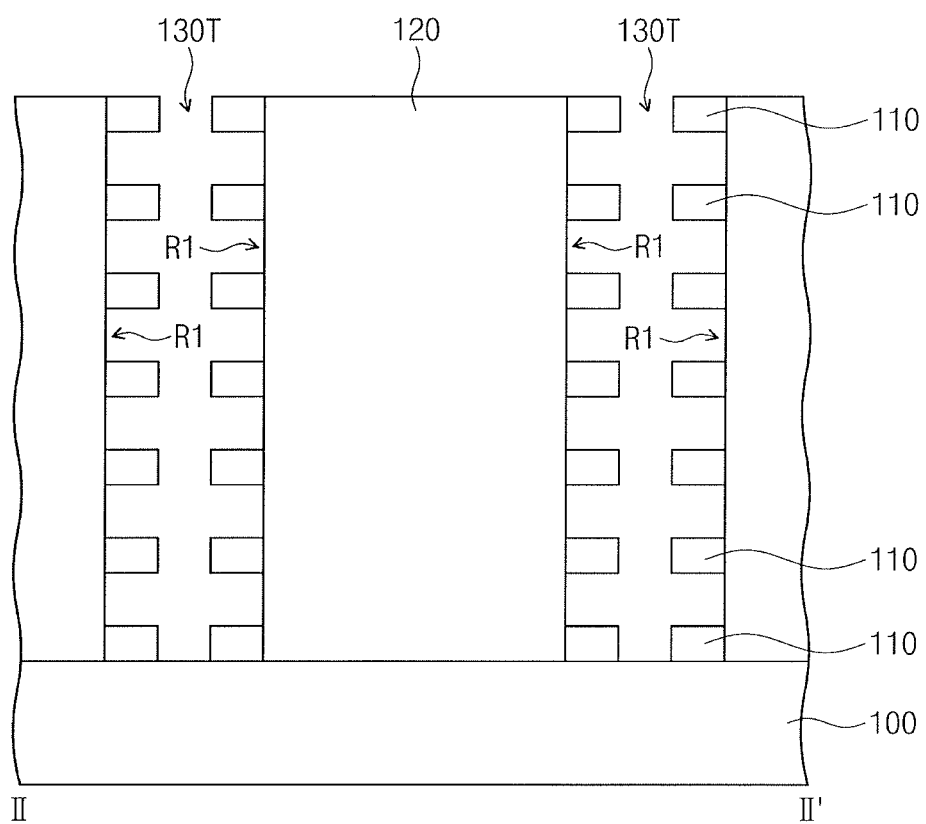

Referring to FIGS. 2, 14A, and 14B, a pair of trenches 130T may be formed to penetrate the thin structure TS. The pair of trenches 130T may extend in the first direction D1 and may be spaced apart from each other in the second direction D2. The pair of trenches 130T may be spaced apart from each other in the second direction D2 with the buried insulating patterns 120 therebetween. Each of the pair of trenches 130T may expose sidewalls of the insulation layers 110 and the sacrificial layers 115 of the thin structure TS and may expose the surface of the substrate 100. The trenches 130T may be formed by, for example, forming a mask pattern on the thin structure TS to define a region in which the trenches 130T are to be formed and etching the thin structure TS using the mask pattern as an etch mask.

Thereafter, portions of the sacrificial layers 115 exposed by each of the trenches 130T may be removed, such that first recess regions R1 may be formed between the insulation layers 110.

The first recess regions R1 may be formed by, for example, etching the sacrificial layers 115 by an etching process having an etch selectivity with respect to the insulation layers 110, the buried insulating patterns 120, and the substrate 100. The first recess regions R1 may horizontally extend from each of the trenches 130T. The recess regions R1 may extend in the first direction D1 and may be spaced apart from each other in the third direction D3. Each of the first recess regions R1 may be formed between a pair of insulation layers 110 adjacent to each other in the third direction D3. Each of the recess regions R1 may extend in the first direction D1 and may expose sidewalls of the buried insulating pattern 120 and a sidewall of the sacrificial layer 115 between the buried insulating patterns 120.

Figure 15A:
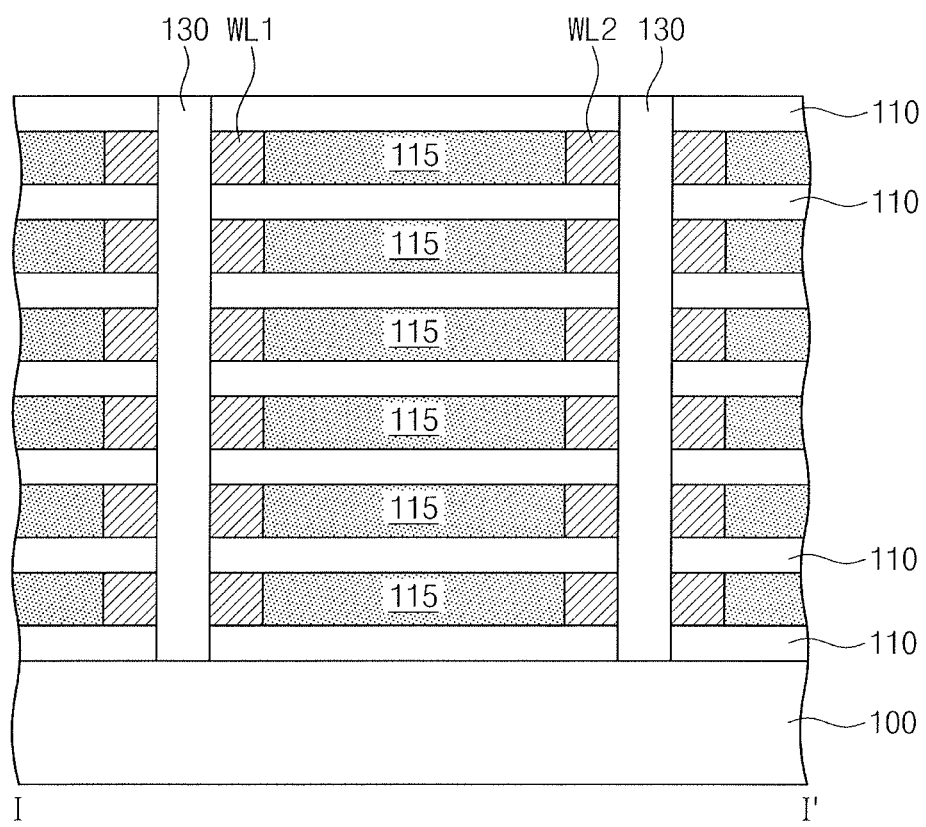
Figure 15B:
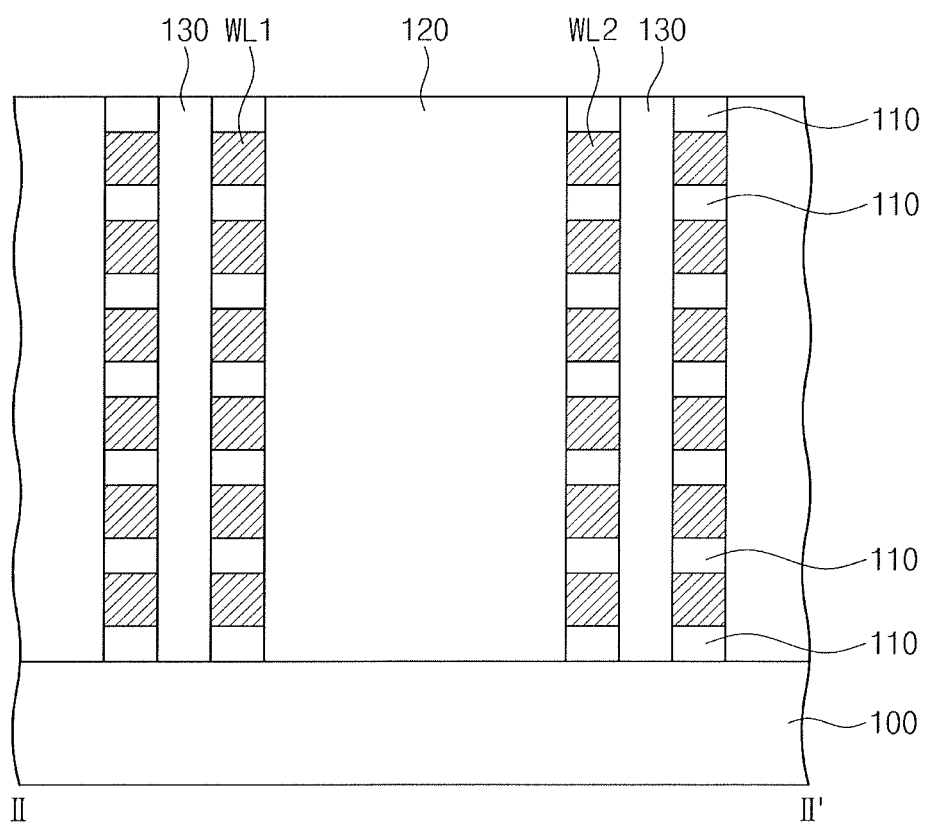

Referring to FIGS. 2, 15A, and 15B, the first and second word lines WL1 and WL1 may be formed in each of the first recess regions R1. The first and second word lines WL1 and WL2 may be formed by, for example, forming a first conductive layer on the thin structure TS to fill the first recess regions R1 and at least a portion of each of the trenches 130T and removing the first conductive layer from the trenches 130T. The first conductive layer may include metal (e.g., copper, tungsten, or aluminum) and/or metal nitride (e.g., tantalum nitride, titanium nitride, or tungsten nitride). The removal of first conductive layer may include etching the first conductive layer until the upper surface of the thin structure TS and an inner surface of each of the trenches 130T are exposed. As the first conductive layer is etched, the first and second word lines WL1 and WL2 may be locally formed in the recess regions R1. The first and second word lines WL1 and WL2 may respectively extend in the first direction D1 and may contact the sidewalls of the buried insulating patterns 120 and the sacrificial layers 115 between the buried insulating patterns 120.

After the first and second word lines WL1 and WL2 are formed, the separation insulating patterns 130 may be formed in the trenches 130T, respectively. The separation insulating patterns 130 may be formed by, for example, forming a separation insulating layer on the thin structure TS to fill the trenches 130T and planarizing the separation insulating layer until the upper surface of the thin structure TS is exposed. The separation insulating patterns 130 may be locally formed in the trenches 130T by the planarization process. The separation insulating patterns 130 may extend in the first direction D1 and may be spaced apart from each other in the second direction D2 with the first and second word lines WL1 and WL2 therebetween. The separation insulating patterns 130 may include oxide, nitride, and/or oxynitride.

Figure 16:
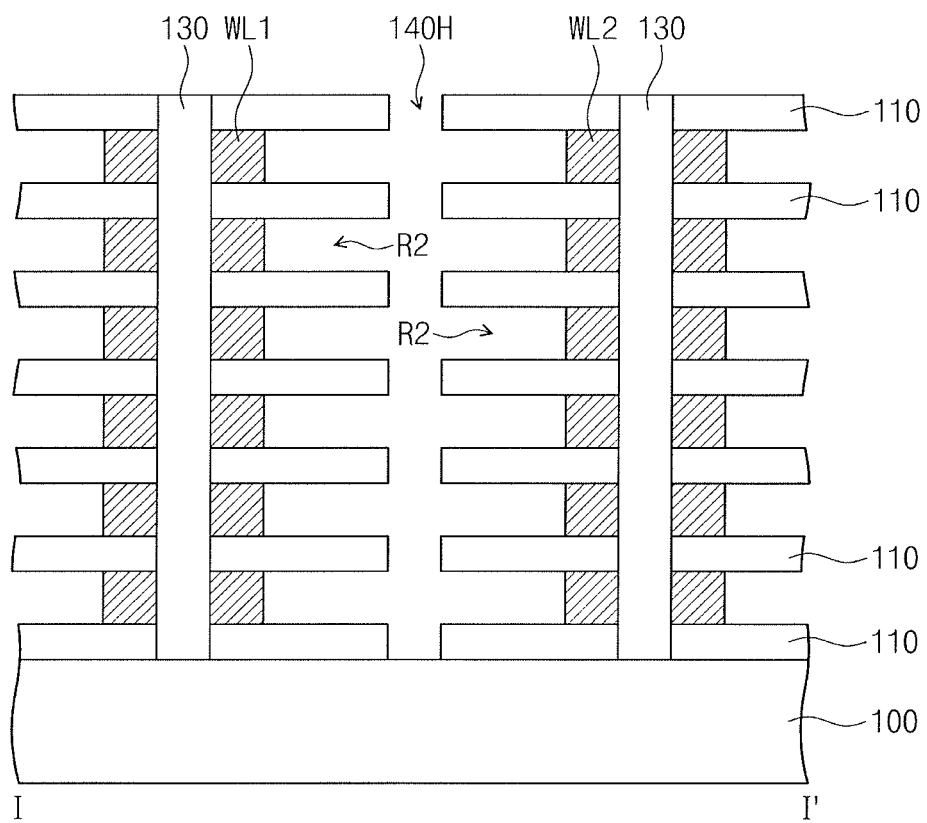

Referring to FIGS. 2 and 16, vertical holes 140H may be formed to penetrate the thin structure TS. The vertical holes 140H may be spaced apart from each other in the first direction D1 between the separation insulating patterns 130. The vertical holes 140H and the buried insulating patterns 120 may be alternately arranged along the first direction D1. Each of the vertical holes 140H may expose the sidewalls of the insulation layers 110 and the sacrificial layers 115 and the upper surface of the substrate 100. Each of the vertical holes 140H may expose sidewalls of a pair of buried insulating patterns 120 adjacent to each other in the first direction D1. The vertical holes 140H may be formed by, for example, form a mask pattern on the thin structure TS to define a region in which the vertical holes 140H are to be formed and etching the thin structure TS using the mask pattern as an etch mask.

Thereafter, the sacrificial layers 115 exposed by each of the vertical holes 140H may be removed to form second recess regions R2 between the insulation layers 110. As an example, the second recess regions R2 may expose one sidewalls of the first and second word lines WL1 and WL2. Alternatively, when the second recess regions R2 are formed, portions of the sacrificial layers 115 may remain between the insulation layers 110.

The second recess regions R2 may be formed by, for example, etching the sacrificial layers 115 by an etching process having an etch selectivity with respect to the insulation layers 110, the buried insulating patterns 120, and the substrate 100. The second recess regions R2 may horizontally extend from each of the vertical holes 140H. Each of the recess regions R2 may be formed between a pair of insulation layers 110 adjacent to each other in the third direction D3 and between the pair of buried insulating patterns 120 adjacent to each other in the first direction D1.

Figure 17:
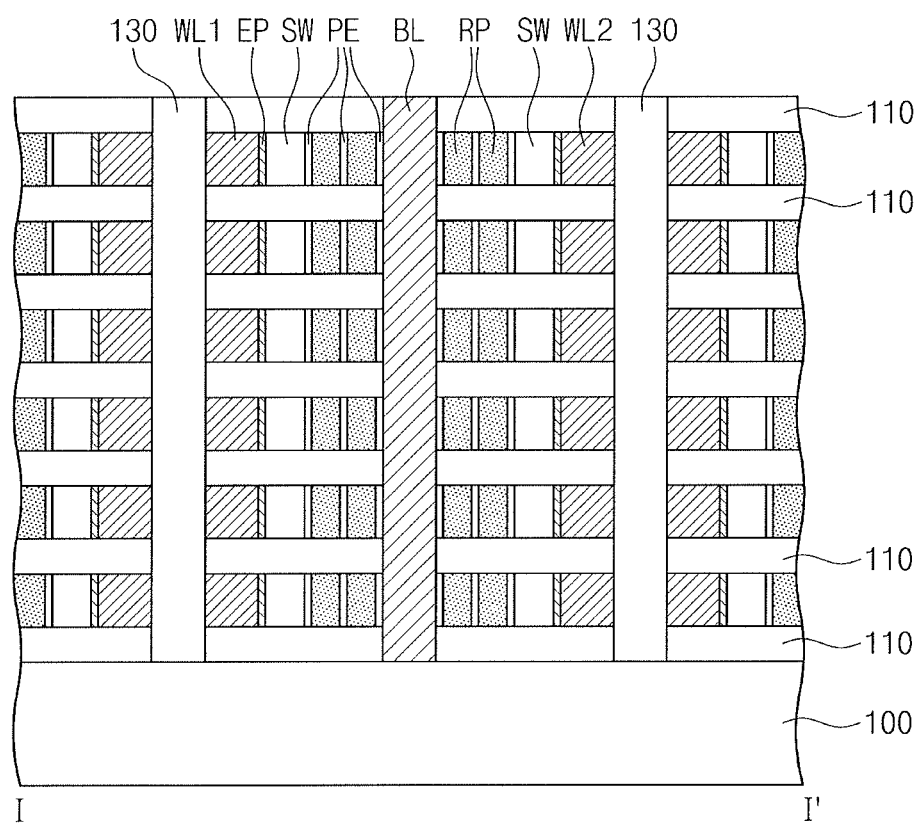

Referring to FIGS. 2 and 17, the switching elements SW may be formed to partly fill the second recess regions R2. The switching elements SW may be formed by forming a switching layer to conformally cover the inner surfaces of the second recess regions R2 and removing a portion of the switching layer in portions of the second recess regions R2 to locally form the switching elements SW in the second recess regions R2, respectively.

In some embodiments, in the case in which the sacrificial layers 115 includes the chalcogenide material, when the second recess regions R2 are formed, portions of the sacrificial layers 115 may remain between the insulation layers 110, and the remaining portions of the sacrificial layers 115 may constitute the switching elements SW.

Prior to forming the switching elements SW, the intermediate electrode EP may be formed on one sidewall of each of the first and second word lines WL1 and WL2 exposed in the second recess regions R2. The intermediate electrode EP may be formed by, for example, forming a metal layer on the thin structure TS to fill the second recess regions R2 and at least a portion of each of the vertical holes 140H, removing the metal layer from each of the vertical holes 140H, and recessing the metal layer until the metal layer remains to a desired thickness in each of the second recess regions R2.

After the switching elements SW are formed, preliminary electrodes PE and the variable resistance patterns RP may be alternatively formed in the second recess regions R2.

The preliminary electrodes PE may be respectively formed by, for example, forming a conductive layer on the thin structure TS to fill the second recess regions R2 and at least a portion of each of the vertical holes 140H, removing the conductive layer from each of the vertical holes 140H, and recessing the conductive layer until the conductive layer remains to a desired thickness in each of the second recess regions R2. The conductive layer may include metal or a semiconductor material.

The variable resistance patterns RP may be respectively formed by, for example, forming a variable resistance layer on the thin structure TS to fill the second recess regions R2 and at least a portion of each of the vertical holes 140H, etching the variable resistance layer until the upper surface of the thin structure TS and the inner surface of each of the vertical holes 140H are exposed, and recessing the variable resistance layer until the variable resistance layer remains to a desired thickness in each of the second recess regions R2.

As the variable resistance layer is recessed, the variable resistance patterns RP may be locally formed in each of the second recess regions R2.

Thereafter, the bit lines BL may be formed in the vertical holes 140H. The bit lines BL may be formed by, for example, depositing a metal layer to fill partly or completely the vertical holes 140H and etching the metal layer to expose an upper surface of an uppermost layer of the insulation layers 110. Thus, the bit lines BL may be locally formed in the vertical holes 140H, respectively.

Figure 18:
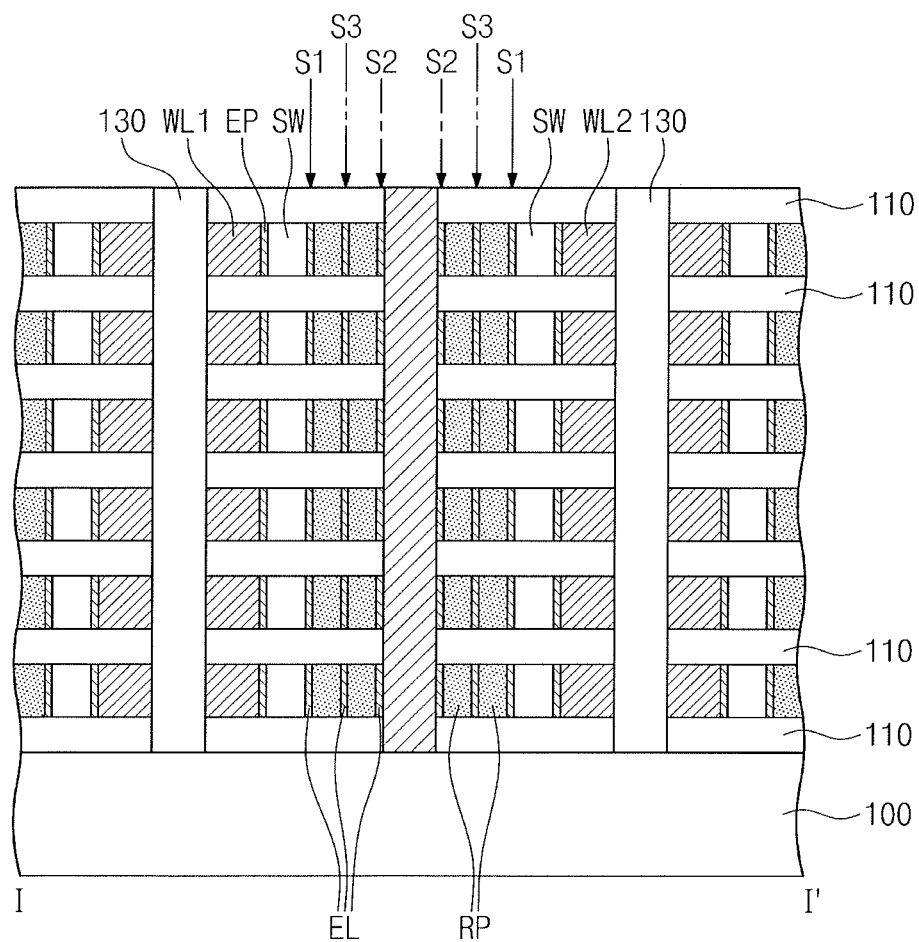

Thereafter, referring to FIGS. 2 and 18, ion implantation processes S1, S2, and S3 may be performed on the preliminary electrodes PE. Thus, the electrodes EL having different resisitivities may be formed between the variable resistance patterns RP.

More specifically, a first ion implantation mask may be formed on the uppermost insulation layer 110. The first ion implantation mask may have openings at positions corresponding to the preliminary electrodes PE adjacent to the switching elements SW. The first ion implantation process S1 may be performed to implant an impurity at a first concentration using the first ion implantation mask. The first ion implantation mask may be removed.

A second ion implantation mask having opening at positions corresponding to the preliminary electrodes PE adjacent to the bit lines BL may be formed on the uppermost insulation layer 110, and then the second ion implantation process S2 may be performed to implant the impurity at a second concentration different from the first concentration using the second ion implantation mask. The second ion implantation mask may be removed.

Thereafter, a third ion implantation mask having opening at positions corresponding to the preliminary electrodes PE between the variable resistance patterns RP may be formed on the uppermost insulation layer 110, and then the third ion implantation process S3 may be performed to implant the impurity at a third concentration different from each of the first and second concentrations using the third ion implantation mask. The third ion implantation mask may be removed.

In the first to third ion implantation processes S1, S2, and S3, at least one of Si, P, C, N, B, and O may be used as the impurity.

FIGS. 19, 20, 21, 22, 23, and 24 are cross-sectional views illustrating a method of manufacturing a three-dimensional memory device and are cross-sectional views taken along line I-I' of FIG. 2. For convenience of explanation, descriptions of the same technical configurations as the method of manufacturing the three-dimensional semiconductor device described above may be omitted.

Figure 19:
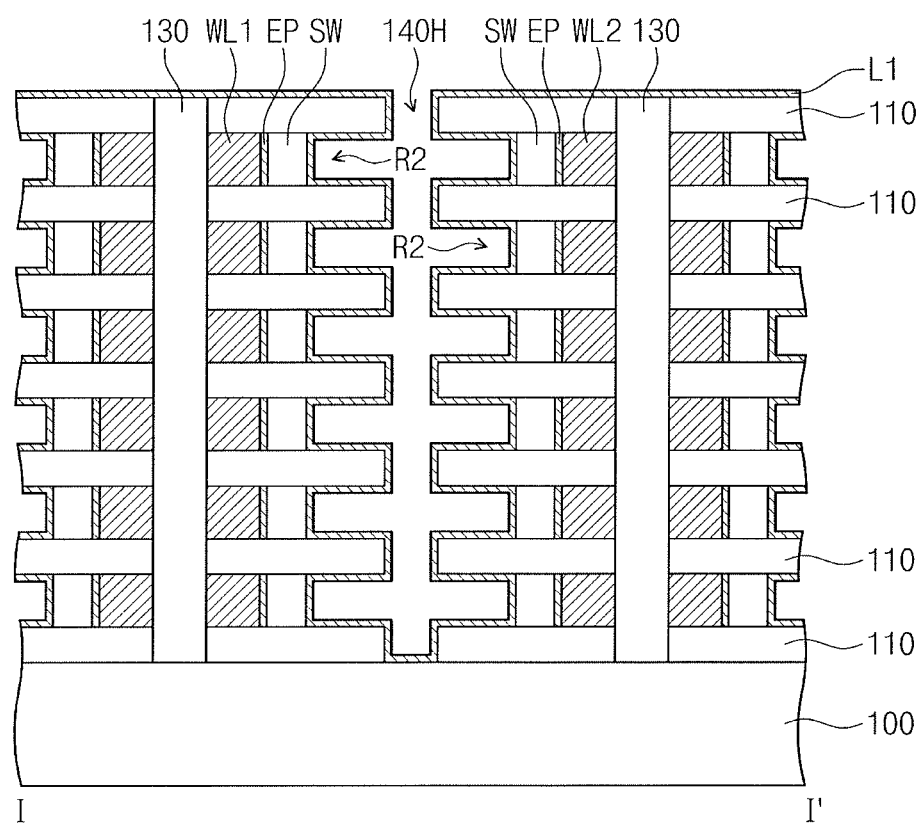
FIGS. 19, 20, 21, 22, 23, and 24 illustrate cross-sectional views of stages in a method of manufacturing a three-dimensional memory device and are cross-sectional views taken along line I-I' of FIG. 2.

Referring to FIG. 19, subsequent to the process described with reference to FIG. 16, after the switching elements SW are locally formed in the second recess regions R2, a first electrode layer L1 may be formed to conformally cover inner surfaces of the second recess regions R2 and inner sidewalls of the vertical holes 140H with an uniform thickness. The first electrode layer L1 may be formed by a chemical vapor deposition process or an atomic vapor deposition process. The first electrode layer L1 may include a material having a first resistivity.

Figure 20:
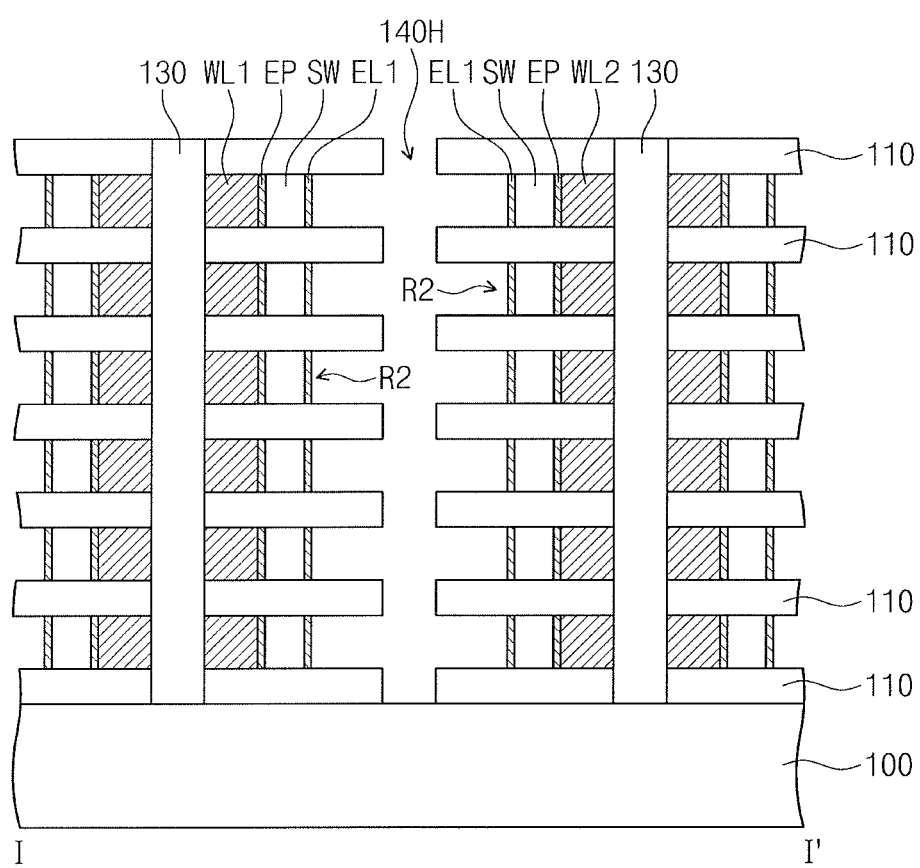

Referring to FIG. 20, a portion of the first electrode layer L1 may be isotropically etched to form the first electrodes EL1 vertically spaced apart from each other. As the first electrode layer L1 is isotropically etched, the inner sidewalls of the vertical holes 140H and portions of upper surfaces and lower surfaces of the insulation layers 110 may be exposed.

Figure 21:
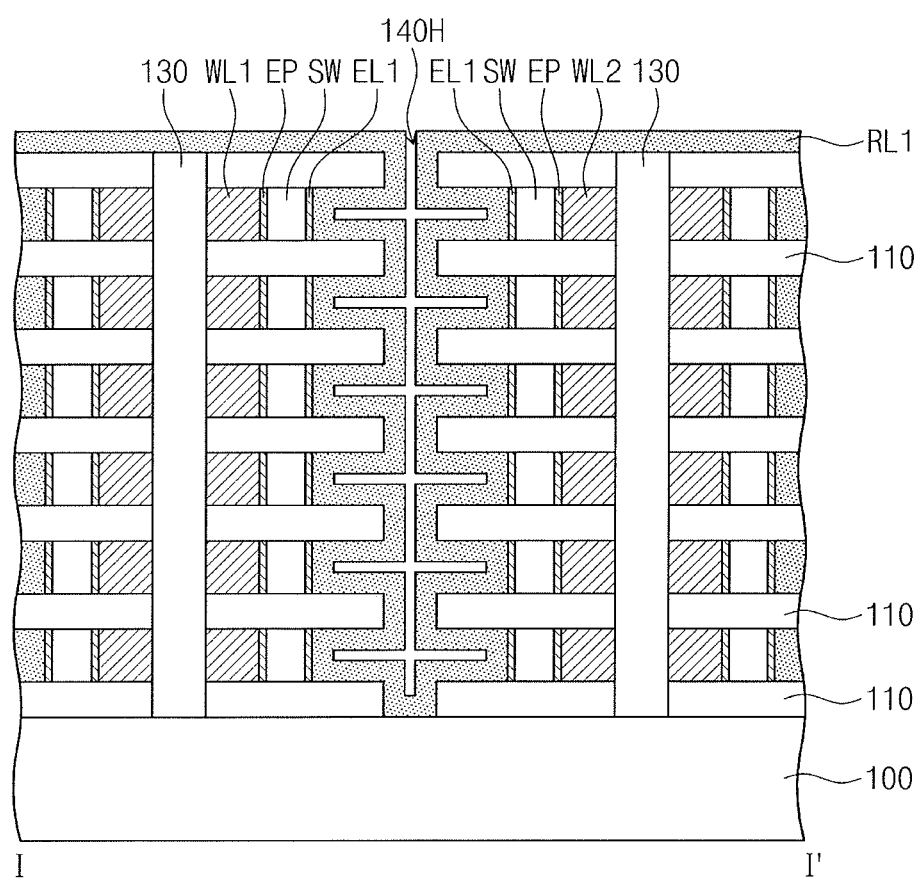

Referring to FIG. 21, a first variable resistance layer RL1 may be formed to conformally cover the inner surfaces of the second recess regions R2 having the first electrodes EL1 and the inner sidewalls of the vertical holes 140H with a uniform thickness.

Figure 22:
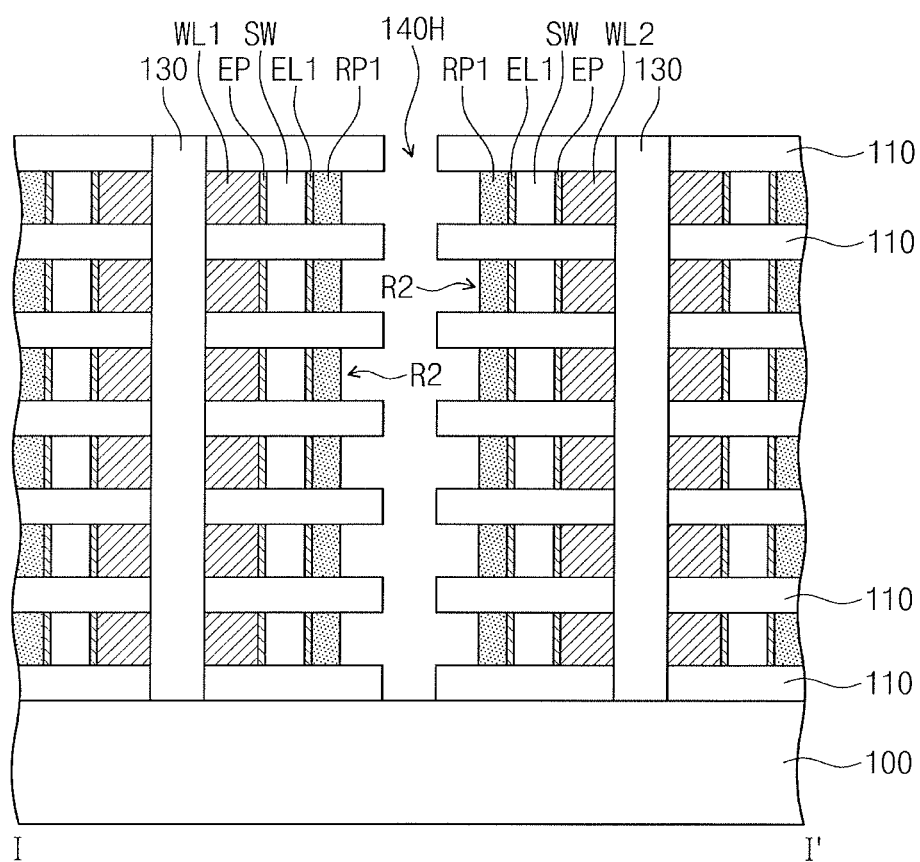

Referring to FIG. 22, a portion of the first variable resistance layer RL1 may be isotropically etched to form the first variable resistance patterns RP1 vertically spaced apart from each other. As the first variable resistance layer RL1 is isotropically etched, the sidewalls of the vertical holes 140H and portions of the upper surfaces and lower surfaces of the insulation layers 110 may be exposed.

Figure 23:
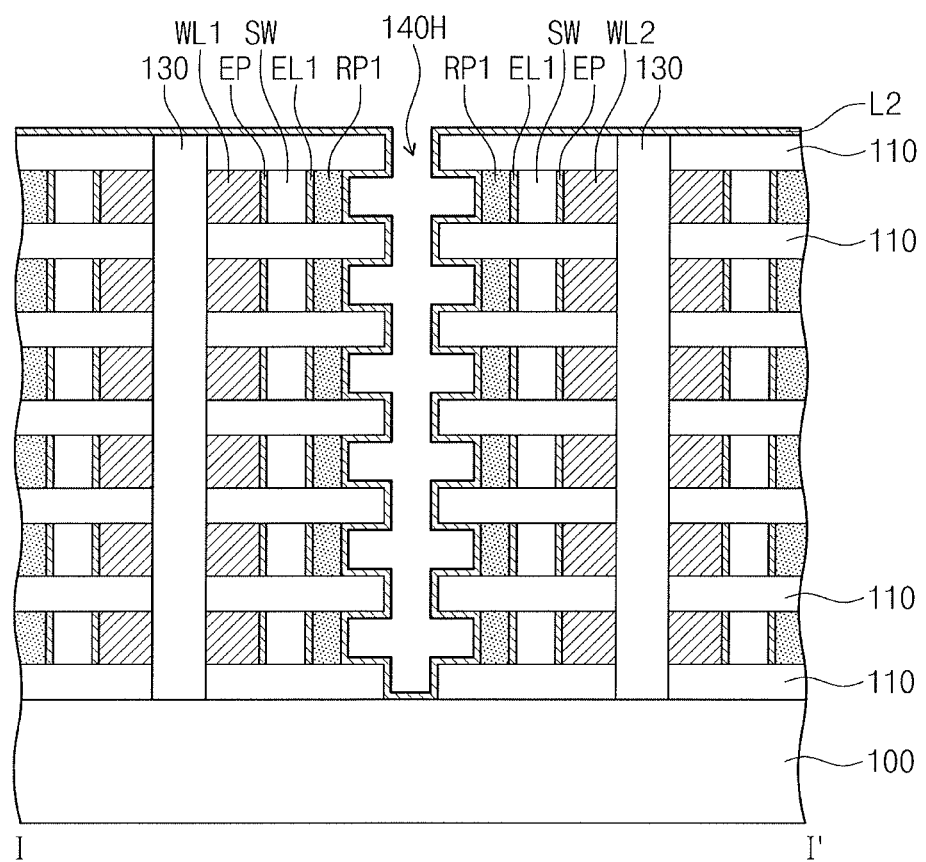

Referring to FIG. 23, a second electrode layer L2 may be formed to conformally cover the inner surfaces of the second recess regions R2 having the first variable resistance patterns RP1 and the inner sidewalls of the vertical holes 140H with a uniform thickness. The second electrode layer L2 may include a material having a second resistivity different from the first resistivity.

Figure 24:
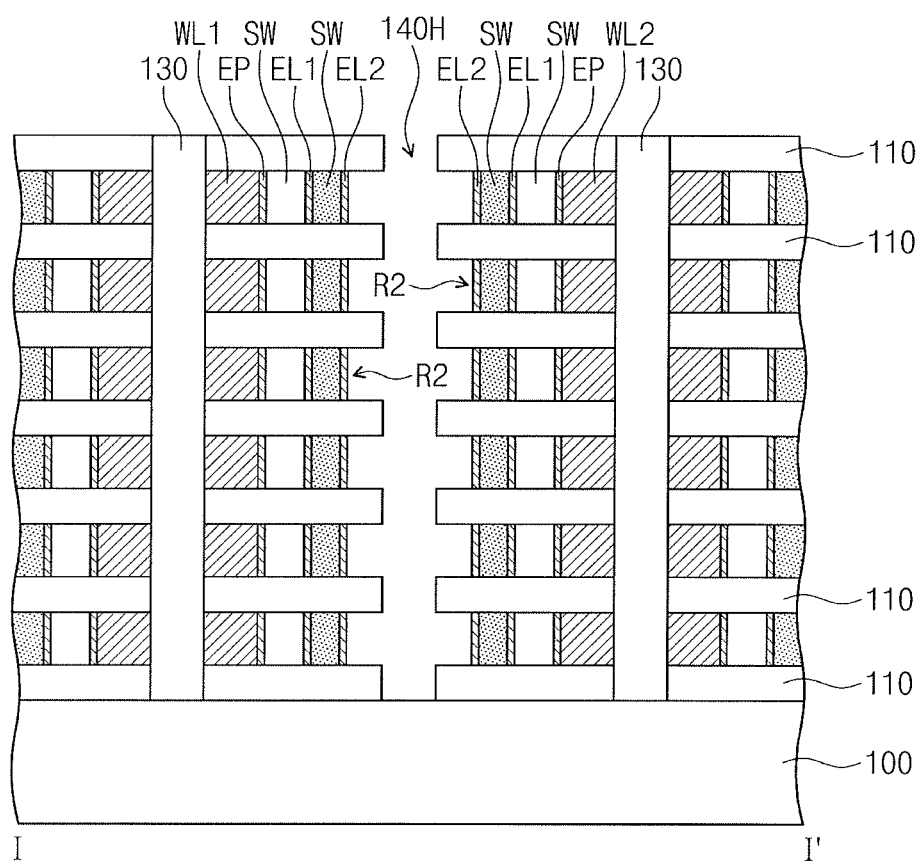

Referring to FIG. 24, a portion of the second electrode layer L2 may be isotropically etched to form the second electrodes EL2 vertically spaced apart from each other. As the second electrode layer L2 is isotropically etched, the sidewalls of the vertical holes 140H and portions of the upper surfaces and lower surfaces of the insulation layers 110 may be exposed.

Thereafter, additional variable resistance patterns and additional electrodes may be alternately and repeatedly formed in the second recess regions R2.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
   a substrate;
   a plurality of first conductive lines extending in a first direction parallel to an upper surface of the substrate, the plurality of first conductive lines being spaced apart from each other in a second direction crossing the first direction and parallel to the upper surface of the substrate;
   a plurality of second conductive lines extending in a third direction perpendicular to the upper surface of the substrate; and
   a plurality of memory cells at cross-points between the plurality of first conductive lines and the plurality of second conductive lines, each of the plurality of memory cells including a variable resistance element and a switching element that are electrically connected in series along the second direction,
   wherein the variable resistance element includes:
      a first variable resistance pattern and a second variable resistance pattern arranged in the second direction;

a first electrode between the first variable resistance pattern and a corresponding one of the plurality of first conductive lines;

a second electrode between the second variable resistance pattern and the switching element; and a third electrode between the first variable resistance pattern and the second variable resistance pattern, the first electrode, the second electrode, and the third electrode having different resistivities.

2. The device as claimed in claim 1, wherein:

the plurality of memory cells are arranged into a cross point memory cell array, the plurality of memory cells including first memory cells and second memory cells that are three dimensionally arranged at the cross-points between the plurality of first conductive lines and the plurality of second conductive lines, and each of the first memory cells is symmetric with a corresponding one of the second memory cells with respect to a corresponding one of the plurality of second conductive lines.

3. The device as claimed in claim 1, wherein each of the plurality of memory cells further includes an intermediate electrode between the switching element and the corresponding one of the plurality of first conductive lines.

4. The device as claimed in claim 1, wherein the plurality of first conductive lines are word lines that are spaced apart from each other in the second direction.

5. The device as claimed in claim 4, further comprising a plurality of insulation layers, the plurality of insulation layers being alternately and repeatedly stacked with the word lines.

6. The device as claimed in claim 5, wherein the plurality of second conductive lines are bit lines that are spaced apart from each other in the first direction, each of the bit lines passing through the plurality of insulation layers.

7. The device as claimed in claim 5, wherein the plurality of insulation layers includes at least one of silicon nitride and silicon oxide.

8. The device as claimed in claim 1, wherein the plurality of second conductive lines are bit lines that are spaced apart from each other in the first direction.

9. The device as claimed in claim 8, further comprising a plurality of buried insulating patterns, the plurality of buried insulating patterns being alternately and repeatedly stacked with the bit lines.

10. The device as claimed in claim 9, wherein the plurality of buried insulating patterns includes at least one of silicon oxide, silicon nitride, and silicon oxynitride.

11. The device as claimed in claim 1, wherein the switching element is a diode or an element based on a threshold switching phenomenon having a non-linear I-V curve.

12. The device as claimed in claim 1, wherein at least one of the first to third electrodes includes a conductive polymer material having an anisotropic resistance characteristic.

13. The device as claimed in claim 1, wherein at least one of the first to third electrodes includes $TiO_2$.

14. A three-dimensional semiconductor memory device, comprising:

a substrate;

a plurality of first conductive lines extending in a first direction parallel to an upper surface of the substrate, the plurality of first conductive lines being spaced apart from each other in a second direction crossing the first direction and parallel to the upper surface of the substrate;

a plurality of second conductive lines extending in a third direction perpendicular to the upper surface of the substrate; and a plurality of memory cells at cross-points between the plurality of first conductive lines and the plurality of second conductive lines, each of the plurality of memory cells including a variable resistance element and a switching element that are electrically connected in series along the second direction, wherein the variable resistance element includes:

a first variable resistance pattern and a second variable resistance pattern arranged in the second direction;

a first electrode between the first variable resistance pattern and a corresponding one of the plurality of first conductive lines;

a second electrode between the second variable resistance pattern and the switching element; and a third electrode between the first variable resistance pattern and the second variable resistance pattern, the first electrode, the second electrode, and the third electrode having different resistivities, and wherein each of the first and second variable resistive patterns includes a sidewall portion extending along a sidewall of the switching element in the third direction, and a horizontal portion extending in the second direction from an end of the sidewall portion.

15. The device as claimed in claim 14, wherein:

the plurality of memory cells are arranged into a cross point memory cell array, the plurality of memory cells including first memory cells and second memory cells that are three dimensionally arranged at the cross-points between the plurality of first conductive lines and the plurality of second conductive lines, and each of the first memory cells is symmetric with a corresponding one of the second memory cells with respect to a corresponding one of the plurality of second conductive lines.

16. The device as claimed in claim 14, wherein each of the plurality of memory cells further includes an intermediate electrode between the switching element and the corresponding one of the first conductive lines.

17. The device as claimed in claim 14, wherein the plurality of first conductive lines are word lines that are spaced apart from each other in the second direction.

18. The device as claimed in claim 17, further comprising a plurality of insulation layers, the plurality of insulation layers being alternately and repeatedly stacked with the word lines.

19. The device as claimed in claim 18, wherein the plurality of second conductive lines are bit lines that are spaced apart from each other in the first direction, each of the bit lines passing through the plurality of insulation layers.

20. The device as claimed in claim 18, wherein the plurality of insulation layers includes at least one of silicon nitride and silicon oxide.

21. The device as claimed in claim 14, wherein the plurality of second conductive lines are bit lines that are spaced apart from each other in the first direction.

22. The device as claimed in claim 21, further comprising a plurality of buried insulating patterns, the plurality of buried insulating patterns being alternately and repeatedly stacked with the bit lines.

23. The device as claimed in claim 22, wherein the plurality of buried insulating patterns includes at least one of silicon oxide, silicon nitride, and silicon oxynitride.

24. The device as claimed in claim 14, wherein the switching element is a diode or an element based on a threshold switching phenomenon having a non-linear I-V curve.

25. The device as claimed in claim 14, wherein at least one of the first to third electrodes includes a conductive polymer material having an anisotropic resistance characteristic.

26. The device as claimed in claim 14, wherein at least one of the first to third electrodes includes $TiO_2$.

* * * * *